US012635424B2

(12) United States Patent
Ishihara et al.

(10) Patent No.: US 12,635,424 B2
(45) Date of Patent: May 19, 2026

(54) QUANTUM DEVICE

(71) Applicant: NEC Corporation, Tokyo (JP)

(72) Inventors: Kunihiko Ishihara, Tokyo (JP);
Suguru Watanabe, Tokyo (JP);
Katsumi Kikuchi, Tokyo (JP)

(73) Assignee: NEC CORPORATION, Tokyo (JP)

( * ) Notice: Subject to any disclaimer, the term of this
patent is extended or adjusted under 35
U.S.C. 154(b) by 479 days.

(21) Appl. No.: 18/234,198

(22) Filed: Aug. 15, 2023

(65) Prior Publication Data

US 2024/0065116 A1 Feb. 22, 2024

(30) Foreign Application Priority Data

Aug. 22, 2022 (JP) ................................. 2022-131703

(51) Int. Cl.
| | |
|---|---|
| *H01R 13/03* | (2006.01) |
| *H01L 23/00* | (2006.01) |
| *H01L 23/367* | (2006.01) |
| *H01L 23/498* | (2006.01) |
| *H01R 13/24* | (2006.01) |
| *H01R 13/405* | (2006.01) |
| *H10N 60/81* | (2023.01) |

(52) U.S. Cl.
CPC ....... *H10N 60/815* (2023.02); *H01L 23/3675*
(2013.01); *H01L 23/49827* (2013.01); *H01L*
*24/16* (2013.01); *H01R 13/03* (2013.01);
*H01R 13/2421* (2013.01); *H01R 13/405*
(2013.01); *H01L 2224/16225* (2013.01)

(58) Field of Classification Search
None
See application file for complete search history.

(56) References Cited

U.S. PATENT DOCUMENTS

| | | | |
|---|---|---|---|
| 2009/0311890 A1 | 12/2009 | Nakayama et al. | |
| 2013/0065455 A1* | 3/2013 | Kawata .............. | H01R 13/2421 |
| | | | 439/700 |
| 2014/0167799 A1* | 6/2014 | Wang ........................ | G01R 1/36 |
| | | | 361/220 |
| 2015/0091600 A1* | 4/2015 | Rathburn ............. | G01R 1/0466 |
| | | | 29/884 |
| 2021/0167271 A1 | 6/2021 | Hidaka et al. | |
| 2021/0399196 A1 | 12/2021 | Kikuchi et al. | |

FOREIGN PATENT DOCUMENTS

| | | |
|---|---|---|
| JP | 2007-033101 A | 2/2007 |
| JP | WO2007/125974 A1 | 11/2007 |
| JP | 2022-002234 A | 1/2022 |
| WO | 2018/212041 A1 | 11/2018 |

* cited by examiner

*Primary Examiner* — Tho D Ta
(74) *Attorney, Agent, or Firm* — Sughrue Mion, PLLC

(57) ABSTRACT

A quantum device includes a quantum chip; an interposer
flip chip mounting the quantum chip; and a socket including
a housing has opening housing signal probe pins and ground
probe pins. An inner wall of the opening housing the ground
probe pin is covered with a metal layer, at least a part of the
ground probe pin is thermally in contact with the metal layer
of the inner wall which continues to a metal layer formed on
at least a partial region of at least one of the first surface and
the second surface of the housing.

19 Claims, 20 Drawing Sheets

1: QUANTUM DEVICE

FIG.2A

1': QUANTUM DEVICE

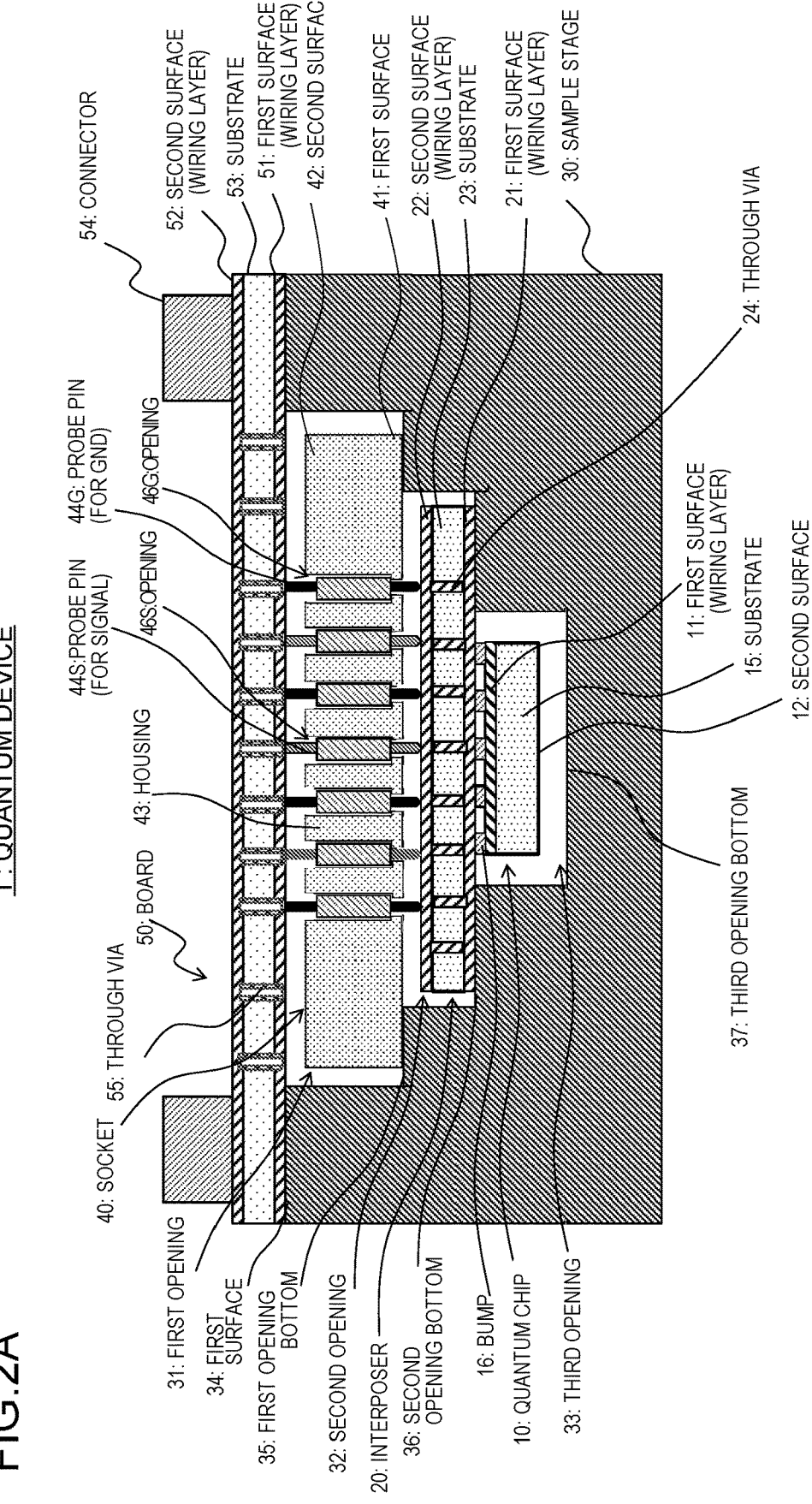

54: CONNECTOR

52: SECOND SURFACE (WIRING LAYER)

53: SUBSTRATE

51: FIRST SURFACE (WIRING LAYER)

42: SECOND SURFACE

41: FIRST SURFACE

22: SECOND SURFACE (WIRING LAYER)

23: SUBSTRATE

21: FIRST SURFACE (WIRING LAYER)

30: SAMPLE STAGE

24: THROUGH VIA

44G: PROBE PIN (FOR GND)

46G:OPENING

44S:PROBE PIN (FOR SIGNAL)

46S:OPENING

43: HOUSING

50: BOARD

40: SOCKET    55: THROUGH VIA

11: FIRST SURFACE (WIRING LAYER)

15: SUBSTRATE

12: SECOND SURFACE

37: THIRD OPENING BOTTOM

31: FIRST OPENING

34: FIRST SURFACE

35: FIRST OPENING BOTTOM

32: SECOND OPENING

20: INTERPOSER

36: SECOND OPENING BOTTOM

16: BUMP

10: QUANTUM CHIP

33: THIRD OPENING

45G:SAMPLE STAGE CONTACT REGION

45A:FIRST SURFACE METAL LAYER

A

41:HOUSING FIRST SURFACE (EXPOSED SURFACE)

44S:PROBE PIN (FOR SIGNAL)

44G:PROBE PIN (FOR GND)

46G: OPENING 44-1:FIRST PLUNGER

46S: OPENING 44-3: BARREL 44-1:FIRST PLUNGER

41:HOUSING FIRST SURFACE (EXPOSED SURFACE)

47:PROTRUSION

A

45B:SECOND SURFACE
METAL LAYER

42:HOUSING SECOND SURFACE
(EXPOSED SURFACE)

44S:PROBE PIN
(FOR SIGNAL)

44G:PROBE PIN
(FOR GND)

48:PROTRUSION

45G:SAMPLE STAGE
CONTACT REGION

45A:FIRST SURFACE
METAL LAYER

41:HOUSING FIRST SURFACE
(EXPOSED SURFACE)

44S:PROBE PIN
(FOR SIGNAL)

44G:PROBE PIN
(FOR GND)

47:PROTRUSION

46G: OPENING

46S: OPENING

46G: OPENING

46S: OPENING

46G: OPENING

45E: SECOND OPENING SIDE WALL METAL LAYER 46S-2: SECOND OPENING 46S-2B: SECOND OPENING BOTTOM PORTION

Figures 12A, 12B:
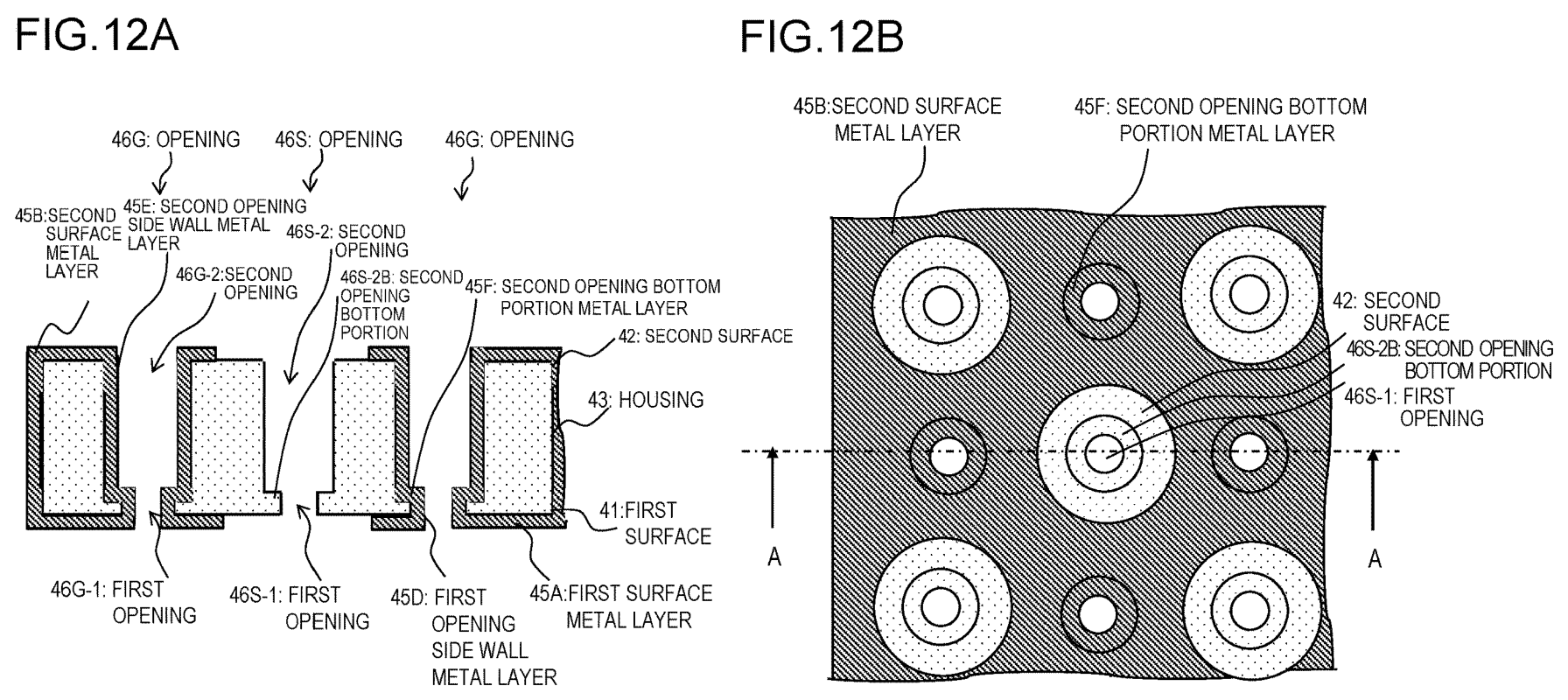

45B:SECOND SURFACE METAL LAYER

45F: SECOND OPENING BOTTOM PORTION METAL LAYER

42: SECOND SURFACE

43: HOUSING

41:FIRST SURFACE

45A:FIRST SURFACE METAL LAYER

45D: FIRST OPENING SIDE WALL METAL LAYER 46G-2:SECOND OPENING 46S-1: FIRST OPENING 46G-1: FIRST OPENING

45B:SECOND SURFACE METAL LAYER

45F: SECOND OPENING BOTTOM PORTION METAL LAYER

42: SECOND SURFACE 46S-2B: SECOND OPENING BOTTOM PORTION 46S-1: FIRST OPENING

41: FIRST SURFACE 46S-1:FIRST OPENING 46G-1: FIRST OPENING

Figures 13A, 13B:
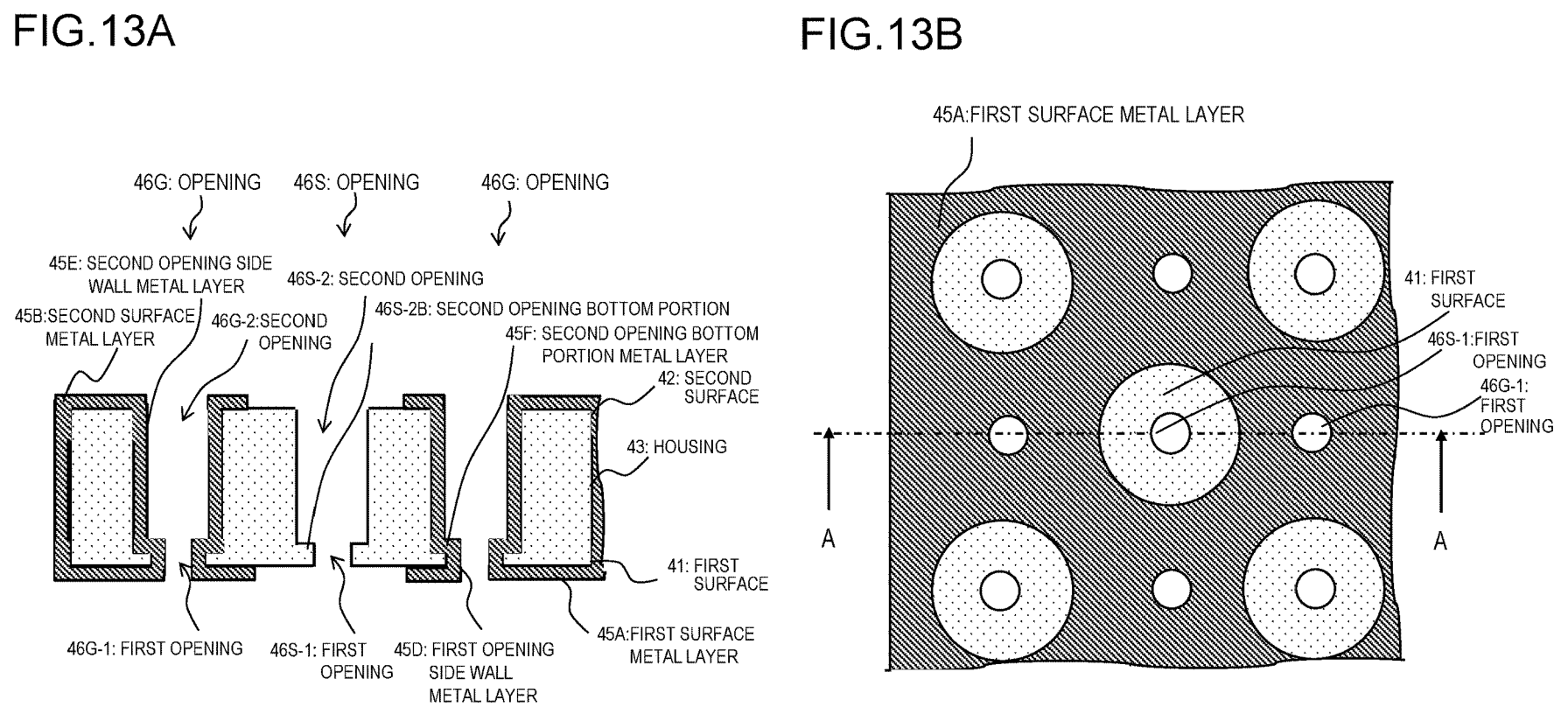

FIRST OPENING

45A:FIRST SURFACE METAL LAYER

46G: OPENING

46S: OPENING

46G: OPENING

45E: SECOND OPENING SIDE WALL METAL LAYER 46G-2:SECOND OPENING

45B:SECOND SURFACE METAL LAYER

46S: OPENING

46G: OPENING 46S-2: SECOND OPENING 46S-2B: SECOND OPENING BOTTOM PORTION

45F: SECOND OPENING BOTTOM PORTION METAL LAYER

42: SECOND SURFACE

43: HOUSING

41: FIRST SURFACE

45A:FIRST SURFACE METAL LAYER

45D: FIRST OPENING SIDE WALL METAL LAYER 46S-1: FIRST OPENING 46G-1: FIRST OPENING

QUANTUM DEVICE

FIELD

CROSS REFERENCE TO RELATED APPLICATIONS

This application is based upon and claims the benefit of the priority of Japanese patent application No. 2022-131703, filed on Aug. 22, 2022, the disclosure of which is incorporated herein in its entirety by reference thereto. This invention relates to a quantum device.

BACKGROUND

Quantum computing denotes a domain in which data are processed by using quantum-mechanical phenomena (quantum bit (qubit)). Quantum mechanical phenomena include superposition of a plurality of states (a quantum variable can take on a plurality of different states simultaneously) and entanglement (a state in which a plurality of quantum variables are related regardless of space or time). A quantum chip includes a quantum circuit that generates a qubit.

Patent Literature (PTL) 1 discloses a quantum device in which a quantum chip using a quantum state is flip-chip mounted on an interposer. That is, the quantum chip is flipped and positioned so that pads (terminals) of the quantum chip are facing to, via bumps, corresponding pads (terminals) of the interposer. In order to use such a quantum device in a superconducting state, it is necessary to cool the quantum device to an extremely low temperature (cryogenic temperature).

PTL 1: International Patent Publication No. WO 2018/212041

PTL 2: Japanese Unexamined Patent Application Publication No. 2022-2234 A

SUMMARY

In the quantum device including a quantum chip and an interposer, when one surface of the interposer is used for cooling by a sample stage, a number of terminals provided on the interposer for external connection is limited.

Further, when a quantum chip is cooled to an extremely low temperature, there is a possibility that a contact with a terminal for external connection is broken due to a stress and a strain caused by a change in volume during a cooling process.

PTL 2 discloses a configuration that enables a quantum device mounted on a sample stage cooled to an extremely low temperature to suppress breaking of a terminal for external connection and to keep the terminal.

The present inventors have earnestly studied to realize a more efficient cooling function for a quantum chip included in a quantum device mounted on a sample stage (pedestal).

It is an object of the present disclosure to provide a quantum device enabled to realize a more efficient cooling function of a quantum chip included in a quantum device to ensure connection reliability of a terminal for external connection and enabled to cope with an increase in the number of terminals.

According to one aspect of the present disclosure, there is provided a quantum device including: a quantum chip including a superconducting quantum circuit; an interposer with a first surface on which the quantum chip is flip-chip mounted, the interposer including a plurality of through vias, each penetrating from the first surface to a second surface opposite of the first surface; and a socket.

The socket includes: a housing including a plurality of openings, each bored between a first surface of the housing faced to the second surface of the interposer and a second surface opposite of the first surface of the housing; and a plurality of probe pins respectively housed in the plurality of openings, each probe pin having a first end and a second end axially opposite of the first end respectively protruding from the first surface and the second surface of the housing, the plurality of probe pins including a plurality of signal probe pins and a plurality of ground probe pin.

At least one opening housing the ground probe pin, includes a first metal layer covering an inner wall of the at least one opening, at least a part of the ground probe pin housed in the at least one opening being thermally in contact with first the metal layer of the inner wall of the at least one opening.

The housing includes a second metal layer formed on at least a partial region of at least one of the first surface and the second surface thereof. The first metal layer of the inner wall of the at least opening housing the ground probe pin, continues to the second metal layer formed on the at least the partial region of the at least one of the first surface and the second surface of the housing.

According to the present disclosure, it is possible to realize a more efficient cooling function of a quantum chip in a quantum device that ensures connection reliability of a terminal for external connection and to cope with an increase in the number of terminals.

BRIEF DESCRIPTION OF DRAWINGS

FIG. 2A is a schematic cross-sectional view illustrating a comparative example 2.

FIG. 12A is a schematic cross-sectional view illustrating a manufacturing of the socket of the disclosure.

FIG. 12B is a schematic plan view illustrating the manufacturing of the socket of the disclosure.

FIG. 13A is a schematic cross-sectional view illustrating a manufacturing of the socket of the disclosure.

FIG. 13B is a schematic plan view illustrating the manufacturing of the socket of the disclosure.

EXAMPLE EMBODIMENTS

In the following, a comparative example is described first, followed by examples of the disclosure. A quantum chip which has qubits is connected to a board (package substrate) or the like via an interposer (interposer board). The qubit is, for example, formed by deposition of a superconducting material (s) on a substrate such as silicon and patterning of the superconducting material. The interposer is responsible for converting, for example, a fine pattern of the quantum chip into a pitch of a package substrate (e.g., organic resin substrate) pattern.

Note: in the present disclosure, the expression "at least one of A and B" means A, B, or (A and B). The term expressed as "--(s)" includes both singular and/or plural form.

Comparative Example 1

Figure 1A:
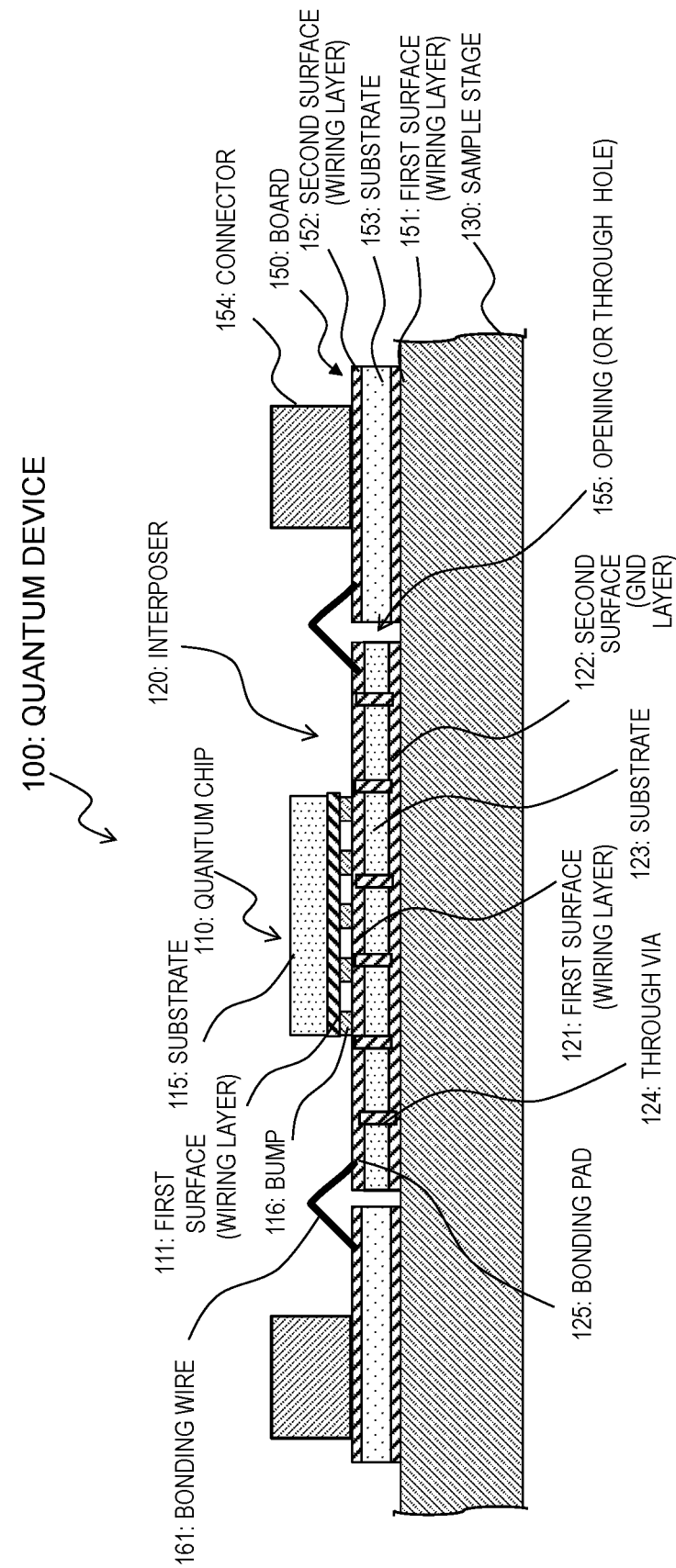
FIG. 1A is a schematic cross-sectional view illustrating a comparative example 1.
Figure 1B:
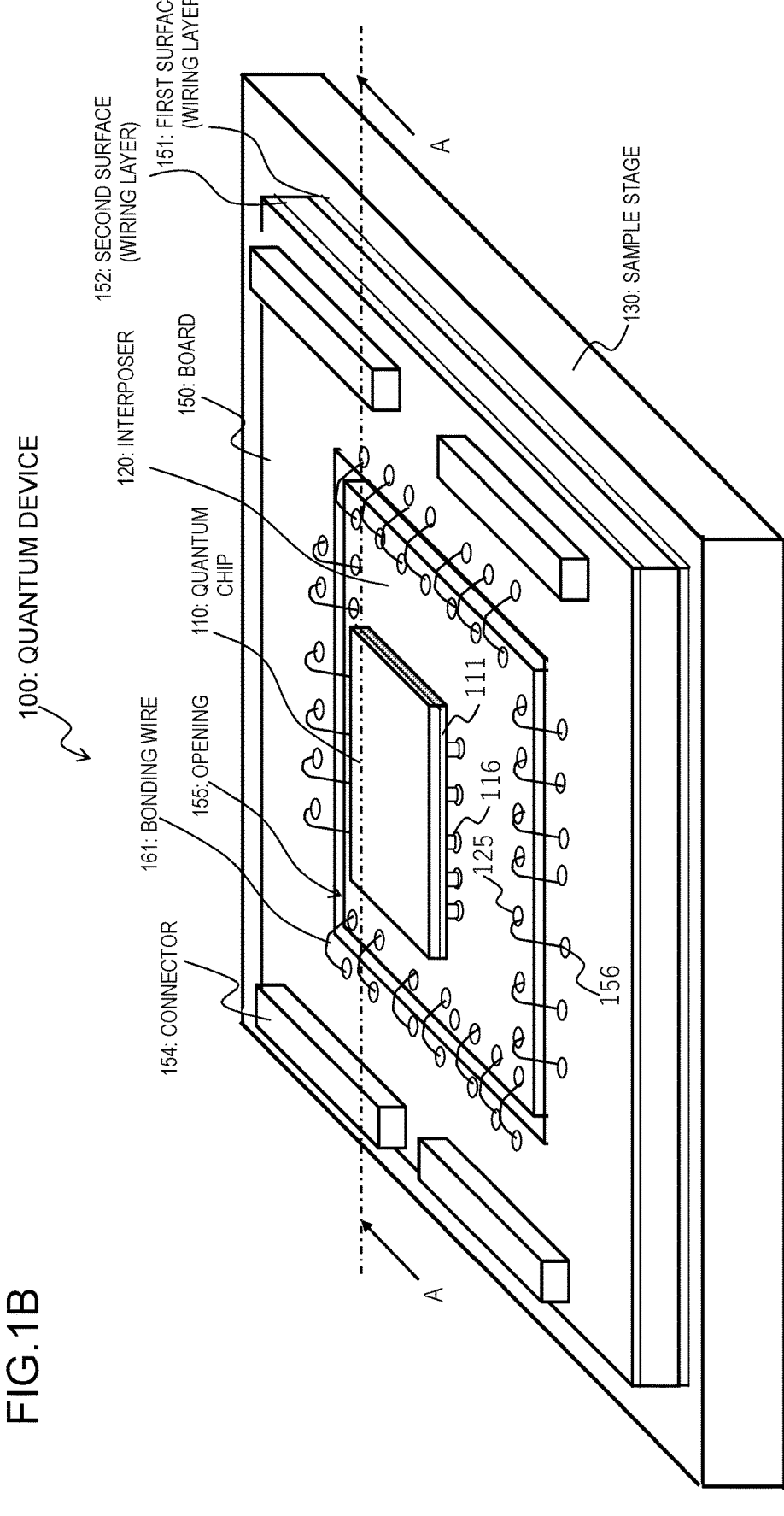
FIG. 1B is a schematic perspective view illustrating the comparative example 1.

FIG. 1A and FIG. 1B schematically illustrate a comparative example 1. FIG. 1B is a perspective view schematically illustrating a quantum device 100 mounted on a sample stage. FIG. 1B is a schematic diagram created to facilitate understanding of the overall structure in FIG. 1A. FIG. 1A is a schematic cross-sectional view along a line A-A in FIG. 1B. Both FIG. 1A and FIG. 1B are newly created for comparative example 1. In FIG. 1A, a configuration with a quantum chip 110 flip-chip mounted thereon is based on the disclosure of PTL 1. It is noted that. in PTL 1, an interposer 120 is placed on a board (base substrate), and the configuration in which the interposer 120 is mounted on a sample stage made of metal, etc., is not disclosed in PTL 1.

In FIG. 1A, a wiring pattern of a wiring layer 121 on a first surface of the interposer 120 (not shown) is arbitrary. For a signal line, a pad arranged at a base of a bump 116 of the interposer 120 and a bonding pad 125 are connected by a signal wiring of the wiring layer 121 on the first surface. A bump 116 for ground (ground bump) is connected to a ground (ground pattern) of the wiring layer 121 on the first surface of the interposer 120 and is connected to the bonding pad 125 for ground (ground interconnect pad). There is provided an opening 155 around a center of a board 150, in which the interposer 120 is placed. A size (length and width) of the opening 155 corresponds to a size of the interposer 120. The bonding pad 125 of the wiring layer 121 of the first surface of the interposer 120 which is placed in the opening 155 of the board 150 and a bonding pad 156 of a wiring layer 152 on a second surface of the board 150 are wire-bonded by a metal wire (bonding wire) 161. A wiring layer 122 on a second surface of the interposer 120 may be a ground plane.

The board 150 includes a substrate (board substrate) 153, a wiring layer 151 on the first surface thereof, a wiring layer 152 on the second surface thereof, and a connector 154 for input/output of an electrical signal from/to an outside, disposed on the second surface thereof. In FIG. 1A, for the sake of drawing convenience, reference numerals indicating the first surface and the second surface themselves are omitted in the interposer 120, and the first surface (wiring layer) 121 and the second surface (wiring layer) 122 designate the first surface, the second surface and respective wiring layers formed thereon. The same may be applicable to the board 150. The same may be also applicable to an interposer 20 and a board 50 illustrated in each of FIG. 2A, FIG. 4, FIG. 5, FIG. 6, etc.

As illustrated in FIG. 1A and FIG. 1B, a ground plane of the wiring layer 122 on the second surface of the interposer 120 is in contact with a sample stage 130 (pedestal) formed of metal and having a cooling function to cool the quantum chip 110. The sample stage 130 is to be placed in a dilution refrigerator to be cooled to an extremely low temperature. The ground plane of the wiring layer 122 on the second surface of the interposer 120 is in contact with the sample stage 130 and connected via a through via 124 for ground (ground through-via) to a ground terminal (ground pattern) of the wiring layer 121 on the first surface of the interposer 120, which is connected via the bump 116 to a ground terminal (ground pattern) of the quantum chip 110. A path reverse to this, i.e., from the quantum chip 110 via the interposer 120 to the sample stage 130 constitutes a thermal path for cooling the quantum chip 110.

When the entire wiring layer 122 of the second surface of the interposer 120 is a ground plane connected to the number of through vias 124 for ground, the entire surface of the wiring layer 122 is substantially in contact with the sample stage 130 and the quantum chip 110 is cooled through the bump 116 for ground and the through vias 124 for ground. Therefore, a cooling performance is high.

However, in the configuration illustrated in FIG. 1A and FIG. 1B, the quantum chip 110 is flip-chip mounted on the wiring layer 121 on the first surface of the interposer 120. The wiring layer 121 on the first surface is connected to the wiring layer 152 on the second surface of the board 150 by the bonding wire 161. Therefore, only a circumferential region of the wiring layer 121 on the first surface of the interposer 120 can be used for terminals (bonding pads 125) for external connection. In the wiring layer 121 on the first surface of the interposer 120, a region where the quantum chip 110 is mounted cannot be used for providing terminals for external connection, thus making it difficult to increase the number of terminals. Therefore, it is not possible to cope with an increase in the number of terminals due to an increase in the number of qubits arranged in the quantum chip 110.

Comparative Example 2

Figure 2B:
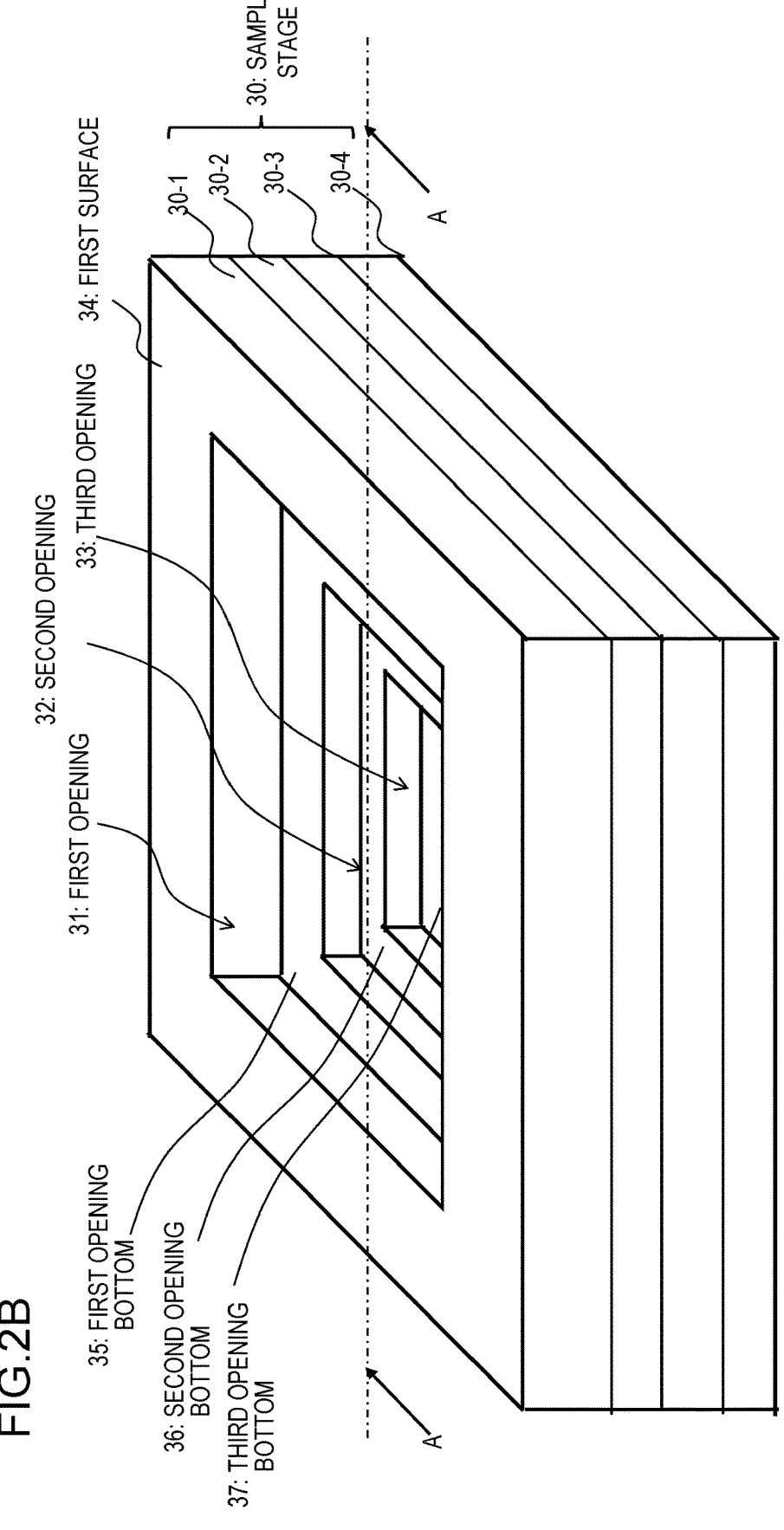
FIG. 2B is a schematic perspective view illustrating a sample stage of the comparative example 2.

FIG. 2A and FIG. 2B illustrate an example (comparative example 2) of a quantum device that can cope with an increase in the number of terminals due to an increase in the number of qubits mounted on a quantum chip and can ensure connection reliability of terminals for external connection. Both FIG. 2A and FIG. 2B are newly created for comparative example 2. A part of FIG. 2A (e.g., a socket provided with probe pins) is based on the disclosure of PTL 2. It is noted that a configuration of a sample stage 30 is different from that disclosed in PTL 2.

A quantum chip 10 is provided with a substrate 15 and a wiring layer 11. The substrate 14 includes, for example, silicon (Si). Note that the substrate 15 is not limited to those including silicon and may include those including other electronic materials, such as sapphire or a compound semiconductor material (Groups IV, III-V, and II-VI). Further, the material is preferably a single-crystalline material, but it may be a polycrystalline material or an amorphous material.

In FIG. 2A, the quantum chip 10 has a wiring layer 11 on the first surface faced to a wiring layer 21 on a first surface of the interposer 20. The wiring layer 11 of the quantum chip 10 is connected via bumps to the wiring layer 21 of the interposer 20. A terminal (wiring pad) of the wiring layer 11 on the first surface of the quantum chip 10 is connected via a bump (metal protrusion) 16 to a corresponding terminal (wiring pad) of the wiring layer 21 on the first surface of the interposer 20. The bump 16 may be formed on the wiring layer 21 on the first surface of the interposer 20, or on the wiring layer 11 side on the first surface of the quantum chip 10.

The wiring layer 11 on the first surface of the quantum chip 10 includes a wiring pattern to form a superconducting quantum circuit and a ground plane (ground pattern). The wiring layer 11 of the first surface patterned on the first surface side of the substrate 15 includes a superconducting material such as niobium (Nb). The superconducting material used in the wiring layer 11 is not limited to niobium (Nb). For example, the superconducting material may include niobium nitride, aluminum (Al), indium (In), lead (Pb), tin (Sn), rhenium (Re), palladium (Pd), titanium (Ti), or an alloy including at least one selected therefrom.

The superconducting quantum circuit formed on the wiring layer 11 on the first surface of the quantum chip 10 may be configured to include a resonator with a Superconducting Quantum Interference Device (SQUID) loop circuit which includes a ring-shaped superconducting member with Josephson junctions provided therein (e.g., a Josephson parametric oscillator). The superconducting material used for the Josephson junction may be, for example, aluminum (Al). As a non-limiting example, the Josephson junction may be formed by depositing a first Al film on the substrate 15 by oblique deposition, oxidizing the first Al film to form an Al oxide film, and depositing a second Al film by oblique deposition in the reverse direction.

The bump 16 has a protrusive shape suitable for controlling a gap height of the substrate to be bonded. The bump 16 may be of any shape such as columnar (cylindrical, polygonal, etc.), pyramidal (which can include a truncated cone and a truncated pyramid as well as a cone, and a pyramid, etc.), spherical, rectangular, etc. The bump 16 may be made of normal-conducting material and formed by laminating superconducting material. The bump 16 may include the same superconducting material as the wiring layer 11 of the quantum chip 10, or it may include a different superconducting material than the wiring layer 11.

In case where the bump 16 includes multiple metal layers, it is preferable that at least one layer includes a superconducting material. The bump 16 may have a layered structure including Nb/In (Sn, Pb, or an alloy including at least one of Sn and Pb)/Ti/Nb (a surface of the wiring layer 21 on the first surface of the interposer 20)/Cu, or a layered structure including Nb (a surface of the wiring layer 11 on the first surface of the quantum chip 10)/Nb (the surface of the wiring layer 21 on the first surface of the interposer 20)/Cu. Alternatively, the bump 16 may have a layered structure including Nb (the surface of the wiring layer 11 on the first surface of the quantum chip 10)/In (Sn, Pb, or an alloy including at least one of Sn and Pb)/Ta (the surface of the wiring layer 21 on the first surface of the interposer 20)/Cu. Further, in case where the bump 16 includes Al and In, TiN may be used for a barrier layer to prevent alloying of Al and In. In such a case, the bump 16 may have a layered structure including Al (the surface of the wiring layer 11 on the first surface of the quantum chip 10)/Ti/TiN/In (Sn, Pb, or an alloy including at least one of Sn and Pb)/TiN/Ti/Al (the surface of the wiring layer 21 on the first surface of the interposer 20)/Cu. Ti is an adhesion layer. A flip-chip connection is preferably Nb (the surface of the wiring layer 11 on the first surface of the quantum chip 10)/In/Ti/Nb (the surface of the wiring layer 21 on the first surface of the interposer 20)/Cu, or Nb (the surface of the wiring layer 11 on the first surface of the quantum chip 10)/Nb (the surface of the wiring layer 21 on the first surface of the interposer 20)/Cu. Alternatively, the bump 16 is made of a normal conducting material such as Cu or silicon dioxide (SiO$_2$), and may have a surface covered with a film of a superconducting material.

As a non-limiting example, a width of the bump 16 may be on an order of a few or several to a few or several tens of micrometers, and a height of the bump 16 may be on an order of a few or several to a few or several tens of micrometers. The quantum chip 10 and the bump 16 may be bonded using such as solid phase bonding. Inside of a refrigerator is subjected to vacuum-evacuation. Regarding solid-phase bonding methods, surface activation bonding, SAB or ultrasonic bonding may be used. In addition, melt joining may be used in case where high temperature can be applied during bonding. Pressure welding may be used in case where resin can be used.

The interposer 20 includes a substrate 23, the wiring layer 21 on the first surface thereof, and a wiring layer 22 on a second surface thereof. In the substrate 23, there are provided a plurality of through vias 24 which connects respectively terminals (pads) of the wiring layer 21 on the first surface and corresponding terminals (pads) of the wiring layer 22 on the second surface. The through via 24 is illustrated such that inside of each via hole is filled with a conductive material (filled via). The through via 24 is not limited to the filled via. The through via 24 may also be configured to have a conductive material deposited on an inner wall of the via hole to connect via ends of the first surface and the second surface (conformal via, etc.). In the interposer 20, the through vias 24 includes a plurality of through vias for signal and a plurality of through vias for ground. The through via for signal connects a signal terminal of the wiring layer 21 on the first surface of the substrate 23 and a signal terminal of the wiring layer 22 on the second surface of thereof. The through via for ground connects a ground terminal of the wiring layer 21 on the first surface of the substrate 23 and a ground terminal of the wiring layer 22 on the second surface of thereof.

In a case where the substrate 15 of the quantum chip 10 is silicon, silicon may be used as the substrate 23 of the interposer 20 in consideration of a linear expansion coefficient, etc. In this case, the interposer 20 may be also referred to as a silicon interposer. The substrate 23 is not limited to one including silicon. The substrate 23 may include other electronic materials such as sapphire or compound semiconductor materials (group IV, III-V and II-VI), glass, and ceramics. In a case where the substrate 23 of the interposer 20 is silicon, the through via 24 may be referred to as a thorough silicon via (TSV). In this case, a via hole of the through vias 24 may be formed after a wiring process on the substrate 23 in a wafer process (termed as via last). In the via last, drilling of a via hole may be performed using etching or laser beam, and plating may be used for filling a conductor into the via hole. Alternatively, the via hole may be formed in the substrate 23 first, and then the wiring process may be performed. The conductor filled into the via hole may be a superconducting material or a normal conducting material, as with the wiring layer 21 on the first surface and the wiring layer 22 on the second surface.

The bump 16 may be formed on the wiring layer 21 on the first surface in a fabrication process of the interposer 20.

The wiring layer 21 on the first surface of the interposer 20 includes the superconducting material mentioned above. The wiring layer 21 on the first surface of the interposer 20 may include the same superconducting material as that included in the wiring layer 11 on the first surface of the quantum chip 10, or a superconducting material different from that included in the wiring layer 11 on the first surface of the quantum chip 10. The wiring layer 21 on the first surface of the interposer 20 preferably includes Nb (e.g., 0.1 μm (micrometer) thick), Cu (e.g., 2 μm thick), and Ti, in the order as viewed from a surface towards the substrate 23. For example, in a case where the substrate 23 includes silicon, the first surface side of the interposer 20 may have a configuration of Nb/Cu/Ti/$SiO_2$/Si (substrate 23).

The wiring layer 22 on the second surface of the interposer 20 may include the above-mentioned superconducting material or a normal-conducting material. The wiring layer 22 on the second surface of the interposer 20 may include the same superconducting material as that included in the wiring layer 21 on the first surface of the interposer 20, or a superconducting material different from that included therein. The wiring layer 22 on the second surface of the interposer 20 may include a normal-conducting material including, for example, copper (Cu), silver (Ag), gold (Au), platinum (Pt), or an alloy including at least one selected therefrom. For example, the wiring layer 22 on the second surface of the interposer 20 may preferably include Cu, and Ti in this order from the first surface to the substrate 23. For example, in a case where the substrate 23 includes silicon, the wiring layer 22 on the second surface of the interposer 20 may have a configuration of Cu/Ti/$SiO_2$/Si (the substrate 23).

The wiring layer 22 on the second surface of the interposer 20 may be of a single layer or of a plurality of layers. The wiring layer 22 on the second surface of the interposer 20 includes terminals (via pads) through which information is acquired from the quantum chip 10 via the through vias 24. An outer edge portion of the wiring layer 21 on the first surface of the interposer 20 is in contact with a second opening bottom 36 made of metal. A contact part of the outer edge portion of the interposer 20 with the second opening bottom 36 may be a ground plane (ground pattern) of the wiring layer 21 on the first surface. In the interposer 20, a through via 24 among the plurality of through vias 24 at a location corresponding to a location in the contact with the second opening bottom 36 may be a ground via (through via for ground). The ground via connects the ground terminal of the wiring layer 21 on the first surface and the ground terminal of the wiring layer 22 on the second surface of the interposer 20. The contact part of the interposer 20 with the second opening bottom 36 of the sample stage 30 may be configured to be fixed with an adhesive material (e.g., conductive adhesive), etc.

A socket 40 is arranged opposing to the wiring layer 22 of the second surface of the interposer 20. The socket 40 includes a plurality of probe pins 44 and a housing (also referred to as a socket housing) 43 in which the plurality of probe pins 44 are housed. In the housing 43, there are provided a plurality of openings 46S and a plurality of openings 46G, each penetrating through the housing 43 from a first surface 41 thereof to a second surface 42 thereof. A probe pin for signal 44S (signal probe pin 44S) is housed in the opening 46S, while a probe pin for ground 44G (ground probe pin 44G) is housed in the opening 46G. The reference numeral 44 is used to indicate the probe pin when there is no need to distinguish between the signal probe pin 44S and the ground probe pin 44G.

As a non-limiting example, the housing 43 preferably includes a material with a linear expansion coefficient of, for example, $0.5\text{-}50\times10^{-6}$/K (Kelvin). The housing 43 preferably may include an insulating material. The housing 43 includes the insulating material at a portion thereof which is at least in contact with the probe pins 44. The housing preferably includes a non-magnetic material. Further, the housing 43 preferably includes a material with a linear expansion coefficient equivalent to that of the interposer 20. The housing 43 may include a quartz or a plastic such as an engineering plastic. The housing 43 may include a composite material with a low linear expansion coefficient, such as aluminum oxide ($Al_2O_3$), mica-based machinable ceramic, aluminum nitride (AlN), zirconia ($ZrO_2$), macor machinable ceramic (Macor is the registered trademark of Corning Inc.), glass, a resin, and a silica filler. the housing 43 may include a superconducting material as long as insulation from a probe pins 44 can be ensured. A contact part of the housing 43 with a first opening bottom 35 of the sample stage 30 may be configured to be fixed with an adhesive material (e.g., conductive adhesive) or the like.

The probe pin 44 has one end (first plunger) brought into contact with the terminal (pad) of the wiring layer 22 on the second surface of the interposer 20, and the other end (second plunger) brought into contact with a terminal (pad) of a wiring layer 51 on a first surface of a board 50, in axially compressed state.

The probe pin 44, preferably, is made of a metal (alloy material) with excellent conductivity, high hardness, and excellent processability is used. The probe pin 44 may include the same superconducting material as the wiring layer 11 on the first surface of the quantum chip 10. Alternatively, the probe pin 44 may include a superconducting material different from the wiring layer 11 on the first surface of the quantum chip 10. Further alternatively, the probe pin 44 may include the normal-conducting material which is the same as the wiring layer 22 on the second surface of the interposer 20. Further alternatively, the probe pin 44 may include a normal-conducting material different from the wiring layer 22 on the second surface of the interposer 20. The probe pin 44 may be preferably made of a non-magnetic material. The probe pin 44 may preferably include, for example, one of a palladium (Pd)alloy, a gold (Au) alloy, beryllium copper (BeCu), Au (plated), niobium (Nb), niobium titanium (Nb—Ti), and titanium (Ti).

The board 50 is provided with a wiring layer 51 on a first surface thereof, a wiring layer 52 on a second surface thereof, and a substrate 53 of on an organic resin. The substrate 53 includes a plurality of through vias 55 that connect terminals of the wiring layer 51 on the first surface and terminals of the wiring layer 52 on the second surface. The through vias 55 are illustrated as a configuration (conformal via) in which a conductive material is deposited on an inner sidewall of a via hole of the through vias 55, but it may, as a matter of course, have a configuration (filled via) in which inside of the via hole is filled with a conductive material. The board 50 is configured as a double-sided substrate, but the board 50 may be configured as a multi-layered substrate. In the wiring layer 52 on the second surface of the board 50, a plurality of connectors 54 for inputting/outputting of signal from/to an outside are provided. As a non-limiting example, the connector 54 may be configured to be provided with, for example, multiple coaxial connectors that are connected to a bundle of flexible coaxial cables (not shown). A contact part of the board 50 with a first surface 34 of the sample stage 30 of metal is a ground plane (ground pattern) of the wiring layer 51 on the first surface of the board 50. The board 50 is not limited to this configuration. As another example, the first surface of the substrate 53 of the board 50 may be in contact with the first surface 34 of the sample stage 30. In this example, since the wiring layer 51 on the first surface of the board 50 is not provided at a contact part where the substrate 53 is in contact with the first surface 34 of the sample stage 30, the through vias 55 is not provided at the contact part. The contact part of the board 50 with the first surface 34 of the sample stage 30 may be configured to be fixed with an adhesive material and so on.

The sample stage 30 has a cooling function. For example, the sample stage 30 is a cold stage that can be cooled to an extremely low temperature of about 10 mK (milli-Kelvin) in a refrigerator (dilution refrigerator). The sample stage 30 preferably includes a metal such as Cu, a Cu alloy, Al, etc. In a case where the sample stage 30 includes Al, the sample stage 30 may be subjected to insulation by an alumite treatment. A superconducting phenomenon at an extremely low temperature of 9.2 [K] or lower is used when Nb is used as a superconducting material of the quantum chip 10, and a superconducting phenomenon at an extremely low temperature of 1.2 [K] or lower is used when it Al is used as the superconducting material of the quantum chip 10. Therefore, the sample stage 30 that can be cooled to such an extremely low temperature is used. The sample stage 30 is not limited only to be made of metal, but can also be made of for example, a high thermal conductivity ceramic that can be cooled to an extremely low temperature. The quantum chip 10, the interposer 20 and the socket 40 are disposed within an opening space (or recessed space) formed on a surface of the sample stage 30. As illustrated in FIG. 2B, the surface of the sample stage 30 has a first opening 31 with the largest opening diameter, a second opening 32 in a center of a bottom (a first opening bottom) 35 of the first opening 31, and a third opening 33 in a center of a bottom (a second opening bottom) 36 of the second opening 32. In FIG. 2B, the sample stage 30 is a quadrangular prism for simplicity, A planar and three-dimensional shapes of the sample stage 30 are, as a matter of course, not limited to a configuration illustrated in FIG. 2B. The first to third openings 31 to 33 may be rounded at corners.

The sample stage 30 may be provided with a metal plate-shaped base (bottom base) 30-4, a metal plate-shaped hollow base 30-3 having the third opening 33, a metal plate-shaped hollow base having the second opening 32, and a metal plate-shaped hollow base having the first opening 31 and be configured to be stacked and secured in this order.

Alternatively, the sample stage 30 may be manufactured by performing drilling processing on a first surface (top surface) 34 of the sample stage 30 made of metal to form the first opening 31, performing drilling processing on a bottom surface of the first opening 31 to form the second opening 32, and further performing drilling processing on a bottom of the second opening 32 to form the third opening 33. A planar shape and a size of the third opening 33 correspond to a planar shape and a size of the quantum chip 10.

The quantum chip 10 is mounted on the first surface of the interposer 20. In the wiring layer 21 on the first surface of the interposer 20, the ground plane (ground pattern) of the outer edge portion other than a region for mounting the quantum chip 10 is in contact with the second opening bottom 36 (an outer circumference portion of the third opening 33). A planar shape and a size of the second opening 32 of the sample stage 30 correspond to a planar shape and a size of the interposer 20.

As illustrated in FIG. 2A, the interposer 20 is housed in the second opening 32 (cavity), and the quantum chip 10 which is flip-chip mounted on the wiring layer 21 on the first surface of the interposer 20, is housed in the third opening 33 (cavity) of the sample stage 30. A predetermined gap is provided between the second surface 12 of the quantum chip 10 and the third opening bottom 37, for example, from a viewpoint of mounting technique. However, this does not preclude a configuration in which the predetermined gap is further narrowed or there is no gap between the second surface 12 of the quantum chip 10 and the third opening bottom 37.

A predetermined gap is also provided between a side surface of the interposer 20 and a side surface of the second opening 32 (cavity). However, this does not preclude a configuration in which the predetermined gap is further narrowed or there is no gap between a side surface of the interposer 20 and a side surface of the second opening 32.

A planar shape and a size of the first opening 31 correspond to a planar shape and a size of the socket 40. The socket 40 is housed in the first opening 31 (cavity). In the first surface 41 of the socket 40, an outer edge portion other than a region for connection with the interposer 20 (region where the probe pins 44G and 44S are disposed) is in contact with the first opening bottom 35 (an outer circumference portion of the second opening 32). On the first surface of the board 50, an outer circumference portion other than a region facing to a second surface 42 of the socket 40 is in contact with an outer circumference portion of the first opening 31 on the first surface (top surface) 34 of the sample stage 30. A predetermined gap is also provided between a side surface of the socket 40 and a side surface of the first opening 31 (cavity). However, this does not preclude a configuration in which the predetermined gap is further narrowed or there is no gap between the side surface of the socket 40 and the side surface of the first opening 31.

Figures 3A, 3B:
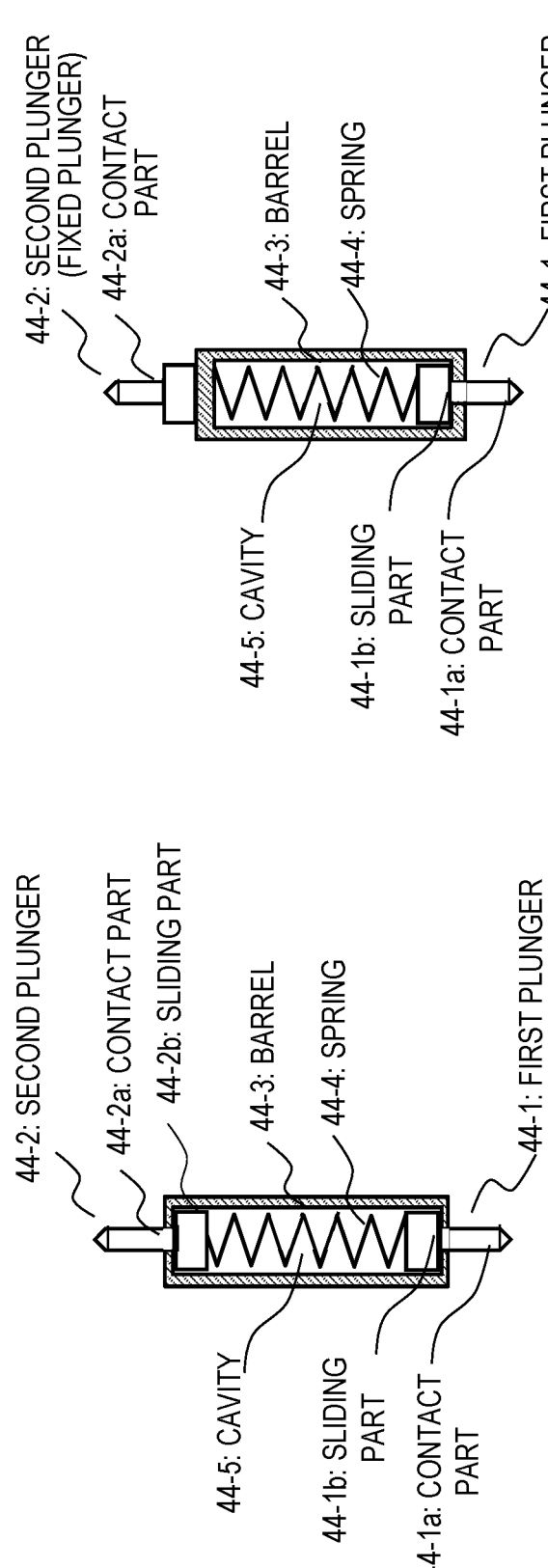
FIG. 3A illustrates schematically a probe pin of a both ends movable type.
FIG. 3B illustrates schematically a probe pin of a one end movable type.

FIG. 3A is a schematic diagram illustrating one example of a probe pin 44 of a both ends movable type. In the example illustrated in FIG. 3A, the probe pin 44 of the both ends movable type includes a hollow cylindrical and conductive barrel (pipe) 44-3, a first plunger 44-1 disposed at one end (first end) of an axial (longitudinal) direction in a cavity 44-5 of the barrel 44-3, a second plunger 44-2 disposed at another end (second end) of the axial direction in the cavity 44-5 of the barrel 44-3, and a spring (coil spring) 44-4 that is housed in a cavity 44-5 of the barrel 44-3 and elastically presses respectively the first and second plungers 44-1 and 44-2 in opposite axial directions. The first and second plungers 44-1 and 44-2 can slide axially in the barrel 44-3. The first and second plungers 44-1 and 44-2 include respectively contact parts 44-1a and 44-2a and sliding parts 44-1*b* and 44-2*b* that slide within the cavity 44-5 of the barrel 44-3. The first plunger 44-1 of the probe pin 44, is housed in an opening (through hole) of the housing 43, is made in contact with the terminal (pad) of the wiring layer 22 on the second surface of the interposer 20. The second plunger 44-2 is made in contact with the terminal (pad) of the wiring layer 51 on the first surface of the board 50.

FIG. 3B is a schematic diagram illustrating one example of a probe pin 44 of a one end movable type. In the example illustrated in FIG. 3B, in the probe pin 44 of the one end movable type, a second plunger 44-2 is fixed to a barrel 44-3, and only a first plunger 44-1 can slide axially in the barrel 44-3. The second plunger 44-2 may be referred to as a fixed plunger.

Most of current flowing through the probe pin 44 flows from one of the first and second plungers 44-1 and 44-2 via the barrel 44-3 to the other one of the first and second plungers 44-1 and 44-2.

In the examples illustrated in FIG. 3A and FIG. 3B, tips of the contact parts 44-1*a* and 44-2*a* of the first and second plungers 44-1 and 44-2 are illustrated as a convex shape, such as a cone shape or a truncated cone shape, for simplicity, but the shape of each tip of the first and second plungers 44-1 and 44-2 can be arbitrary, such as a triangular pyramid, a crown shape with tips divided into four acute angles, a cup shape and any other shape.

In FIG. 2A, the quantum device 1' includes the socket 40 with the probe pins 44 of a both ends movable type or a one end movable type, to eliminate contact failure due to deformation caused by difference in linear expansion coefficients of the interposer 20 and the board 50, etc., during cooling to the extremely low temperature in which the superconducting material of the quantum device 1' can achieve superconductivity. The first and second plungers 44-1 and 44-2 of each probe pin 44 (the signal probe pin 44S and the ground probe pin 44G) are axially pushed to be made in contact with the terminal of the wiring layer 51 on the first surface of the board 50 and the terminal of the wiring layer 22 on the second surface of the interposer 20, respectively. In other words, the first and second plungers 44-1 and 44-2 receive a pressure to press the spring 44-4 in the barrel 44-3. This state of receiving pressure allows each probe pin 44 to move in response to shrinkage or other change in a volume associated with cooling, to maintain contact with the terminals, etc., and to prevent wire breakage effectively. As a result, the probe pins themselves can autonomously respond to variations in gap due to the deformation of the interposer 20 and the board 50, as well as manufacturing variations. In addition, the socket 40 makes the second plunger 44-2 of the probe pin 44 mechanically in contact (electrically connect) with the terminals of the wiring layer 51 on the first surface of the board 50, which is provided with the connector(s) 54 that serves as an input/output from/to the outside. Thus, in the quantum device 1', it is possible to secure the number of terminals connecting to outside.

In the example illustrated in FIG. 2A, the quantum chip 10 is housed in the third opening 33 of the sample stage 30, the interposer 20 and the socket 40 are also housed in the second and first openings 32 and 31 of the sample stage 30, respectively. Therefore, the quantum chip 10 is cooled in the sample stage 30 having a cooling function. The ground plane of the outer edge portion of the wiring layer 21 on the first surface of the interposer 20 and a region of the outer edge portion of the first surface 41 of the socket 40 are in contact with the second opening bottom 36 and the first opening bottom 35 of the sample stage 30, respectively. Therefore, the quantum chip 10 can be cooled by heat conduction from the first surface 41 side of the socket 40 in addition to the ground plane of the wiring layer 21 on the first surface of the interposer 20. This improves cooling performance. However, in the above-mentioned comparative example 1, the entire surface of the wiring layer 121 on the first surface of the interposer 120 is in contact with the sample stage 30, whereas in the comparative example 2, a portion of the wiring layer 21 on the first surface of the interposer 20 is in contact with the sample stage 30. Therefore, in the comparative example 2, further improvement in cooling performance of the quantum chip 10 is desired.

The following examples of the disclosure will propose a quantum device which is enabled to realize a more efficient cooling function for the quantum chip 10 than the quantum device 1' illustrated in FIG. 2A and FIG. 2B described as the comparative example 2.

Figure 4:
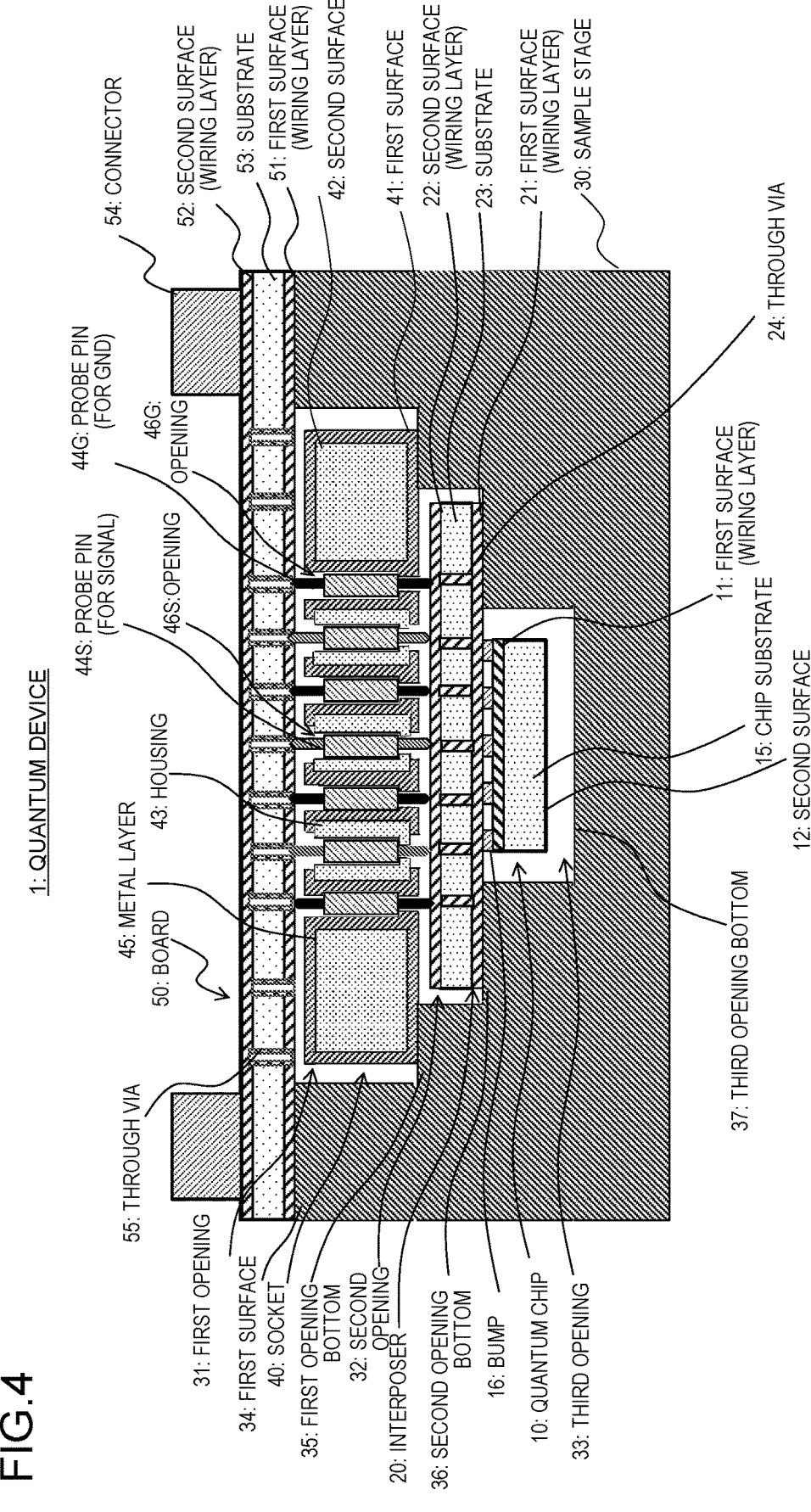
FIG. 4 is a schematic cross-sectional view illustrating an example of the disclosure.

FIG. 4 is a schematic cross-sectional view illustrating a quantum device according to one example of the disclosure. FIG. 4 corresponds to FIG. 2A. Referring to FIG. 4, a quantum device 1 includes a quantum chip 10, an interposer 20 and a socket 40. In FIG. 4, the same or equivalent elements as those illustrated in FIG. 2A are designated by the same reference numerals (or signs) as FIG. 2A. A sample stage 30 can be identical to that described with reference to FIG. 2B. A probe pin may be the same as described with reference to FIG. 3A or FIG. 3B. For this reason, FIG. 2B, FIG. 3A and FIG. 3B will be referenced as appropriate in the following description. In the following, to avoid duplication (or redundancy), description will focus on the socket 40, one of the differences from that illustrated in FIG. 2A, and descriptions of elements identical to those illustrated in FIG. 2A will be omitted except where necessary.

In the socket 40 which includes a housing 43 and a plurality of probe pins 44. A side wall (inner wall) of each of a plurality of openings 46G in which a plurality of ground probe pins 44G are housed respectively, is covered with a metal layer. The metal layer on the side wall (inner wall) of each of the openings 46G and at least a part of each of the plurality of ground probe pins 44G are in mechanical (or physical) and/or thermal contact with each other. The metal layer on each of the side walls of the plurality of openings 46G, which respectively houses the plurality of ground probe pins 44G, is connected to a metal layer 45 (first metal layer) formed on at least part of at least a first surface 41 of the housing 43.

On the other hand, a side wall (inner wall) of each of a plurality of openings 46S, which respectively accommodates a plurality of signal probe pins 44S, is not covered with a metal layer.

A part of the metal layer 45 formed on the first surface 41 of the housing 43 (metal layer 45 of an outer edge portion of the first surface 41) is in contact with a first opening bottom 35, which is a portion of the sample stage 30 that supports the socket 40.

On each of the first surface 41 and a second surface 42 opposite to the first surface 41 of the housing 43, a region in a vicinity of the opening 46S that houses the signal probe pin 44S, is not covered by a metal layer (the region of housing 43 in the vicinity of the opening 46S is exposed). This allows a signal propagating through the signal probe pin 44S housed in the opening 46S of the socket 40 to pass outside of the socket 40. In high-frequency signal transmission, regarding a single-ended signal transmission using a coaxial cable or the like, a signal is propagated by the mutually orthogonal electric field E and magnetic field H generated in a plane perpendicular (i.e., transverse) to the signal propagation direction (axial direction of the signal probe pin 44S) between two wires of the signal probe pin 44S and the ground probe pin 44G (TEM (Transverse ElectroMagnetic) mode). If the metal layer 45 should cover the region in the vicinity of an end of the opening 46S which houses the signal probe pin 44S, on each of the first surface 41 and the second surface 42 of the housing 43, signal strength would be attenuated due to absorption/reflection of the electromagnetic wave, and signal propagation characteristics would be degraded. Therefore, in the socket 40, on each of the first surface 41 and second surface 42 of housing 43, the metal layer 45 is removed in a region in the vicinity surrounding the opening 46S which houses the signal probe pin 44S, and in the vicinity of the opening 46S, a part of each of the first surface 41 and the second surface 42 of the housing 43 is exposed.

Referring to FIG. 4 and FIG. 2B, a board 50 is placed on a first surface (top surface) 34 of the sample stage 30 to cover a first opening 31 which is drilled on the first surface (top surface) 34 of the sample stage 30. An outer circumference region of a third opening 33 on a bottom of the second opening 32 (second opening bottom 36) of the sample stage 30 is in contact with a ground plane of an outer edge portion of the wiring layer 21 on the first surface of the interposer 20, wherein the outer edge portion of the wiring layer 21 surrounds a region of the wiring layer 21 facing the quantum chip 10. An outer circumference region of a first opening 31 on a bottom of the first opening 31 (first opening bottom 35) of the sample stage 30 is in contact with the metal layer 45 of an outer edge portion of the first surface 41 of the socket 40. The second opening bottom 36 and the first opening bottom 35 of the sample stage 30 are also hollow pedestal (hollow support portions) that support the interposer 20 and the socket 40 from below, respectively.

The ground terminals of the wiring layer 11 on the first surface of the quantum chip 10 are thermally connected to the first opening bottom 35 of the sample stage 30 with which the metal layer 45 (first surface metal layer 45A to be described later) on the first surface 41 of the socket 40 is in contact, the bumps 16, ground terminals of the wiring layer 21 on a first surface of the interposer 20 connected to the ground terminals of the wiring layer 11 on the first surface of the quantum chip 10 via the bumps 16, the through vias 24 of the interposer 20, the ground terminals of the wiring layer 22 on the second surface of the interposer 20 connected via the through vias 24 to the ground terminals of the wiring layer 21, the ground probe pins 44G of the socket 40 connected to the ground terminals of the wiring layer 22 of the interposer 20, the metal layers on the side walls of the openings 46G of the housing 43 that respectively houses the ground probe pins 44G, and the metal layer 45 of the socket 40 extending to the metal layers on the side walls of the openings 46G. The ground probe pin 44G may be made of beryllium copper (BeCu) or gold (Au) plated in consideration of thermal conductivity and electrical conductivity.

In the example of the disclosure, the ground probe pin 44G is housed in the opening 46G of socket 40, the metal layer on the side wall of the opening 46G, and the metal layer 45 of the housing 43 form a heat dissipation path to the sample stage 30. According to the comparative example 2 illustrated in FIG. 2A, in a case when the housing 43 is made of insulating material, since the thermal conductivity of the housing 43 is low, the sufficient cooling effect will not be attained even if the housing 43 is in contact with the first opening bottom 35 of the sample stage 30. In contrast, according to the example of the disclosure illustrated in FIG.

4, the socket 40 is provided with the heat dissipation path to the sample stage 30, thus enabling to improve the cooling effect.

Figure 5:
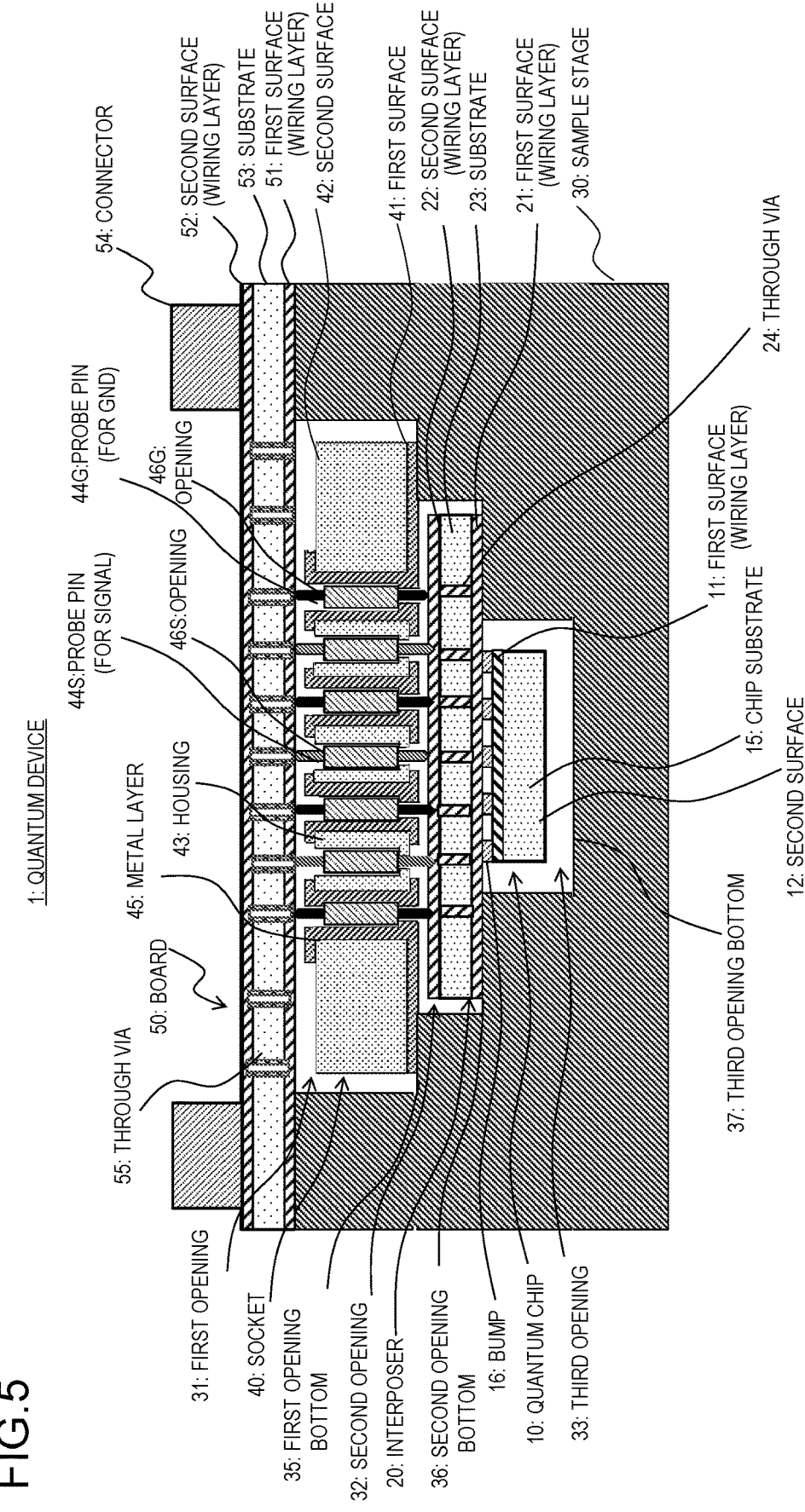
FIG. 5 is a schematic cross-sectional view illustrating a variation 1 of the disclosure.

FIG. 5 is a schematic cross-sectional view illustrating a variation 1 of the example of the disclosure. In the example illustrated in FIG. 5, a metal layer 45 is provided only in the vicinity of the openings 46G for the ground probe pins 44G in a region of an outer edge portion of the second surface 42 that extends up to a side surface of the housing 43 (No metal layer is provided in other regions of the outer edge portion of the second surface 42). No metal layer is provided also on a side surface of the housing 43. In this variation, the side surface of the housing 43 is not in contact with the sample stage 30. Even if a metal layer is provided on an outer edge portion of the second surface 42 that extends up to the side surface of the housing 43, since no metal layer is provided on the side surface of the housing 43, there is no heat path from the metal layer on the outer edge portion of the second surface 42 of the housing 43 to the metal layer on the first surface 41 through the side surface of the housing 43.

Figure 6:
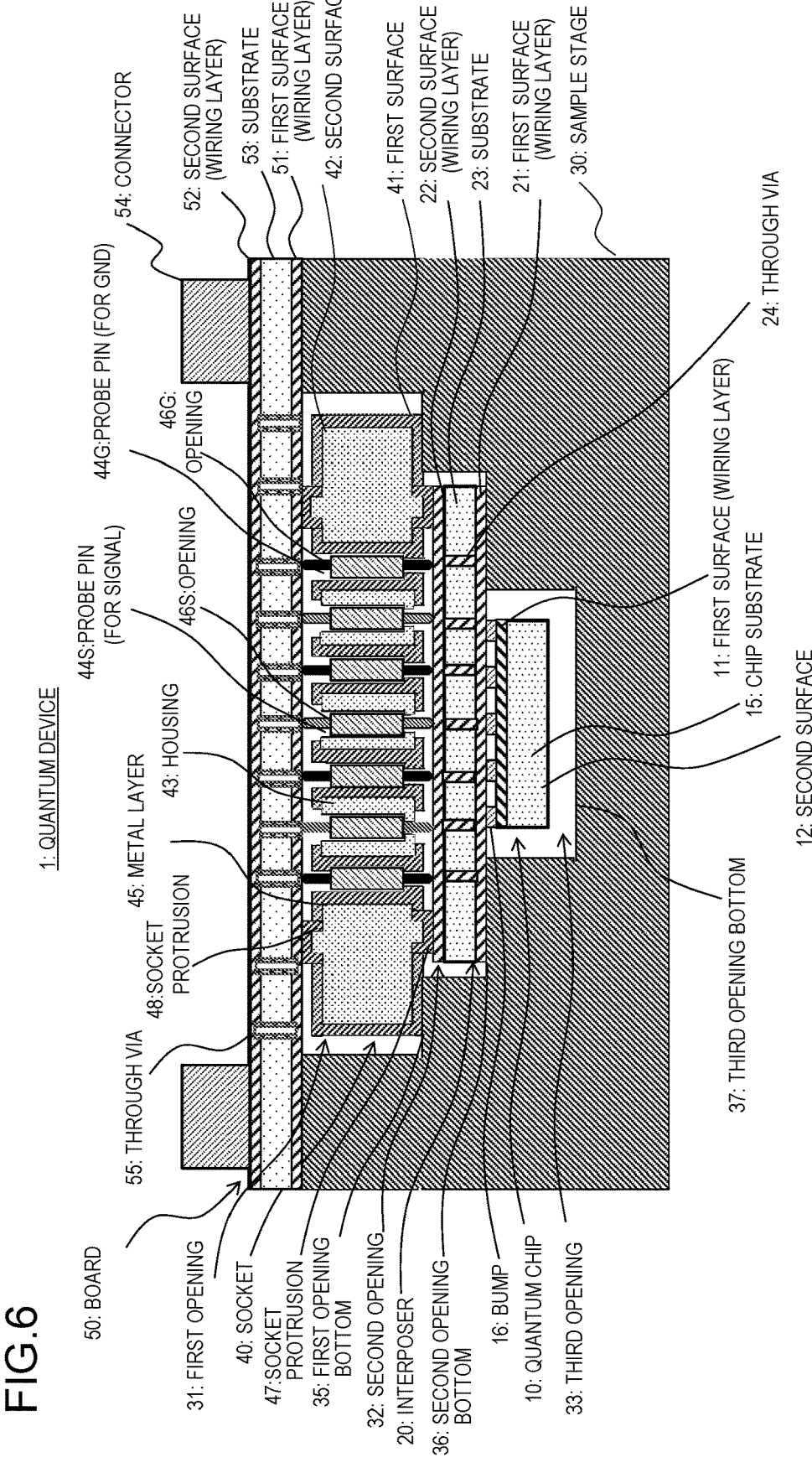
FIG. 6 is a schematic cross-sectional view illustrating a variation 2 of the disclosure.

FIG. 6 is a schematic cross-sectional view illustrating a variation 2 of the example of the disclosure. Referring to FIG. 6, according to the variation 2, a socket 40 includes, on a first surface 41, a protrusion (socket protrusion) 47 which is in contact with a ground plane of a wiring layer 22 on a second surface of an interposer 20 and includes, on a second surface 42, a protrusion (socket protrusion) 48 which is in contact with a ground plane of a wiring layer 51 on a first surface of the board 50. The protrusions 47 and 48 are covered with a metal layer 45, which covers surfaces of the housing 43 (the first surface 41, the second surface 42 and a side surface). A height of the protrusion 47 is set corresponding to a length of the first plunger 44-1 of the probe pin 44 and a gap between the first surface 41 of the housing 43 and the wiring layer 22 on the second surface of the interposer 20 (e.g., an order of tens to a hundred of micrometers). A height of the protrusion 48 is set corresponding to a length of the second plunger 44-2 of the probe pin 44 and a gap between the second surface 42 of the housing 43 and the wiring layer 51 on the first surface of the board 50 (e.g., an order of tens to a hundred of micrometers).

Figure 7A:
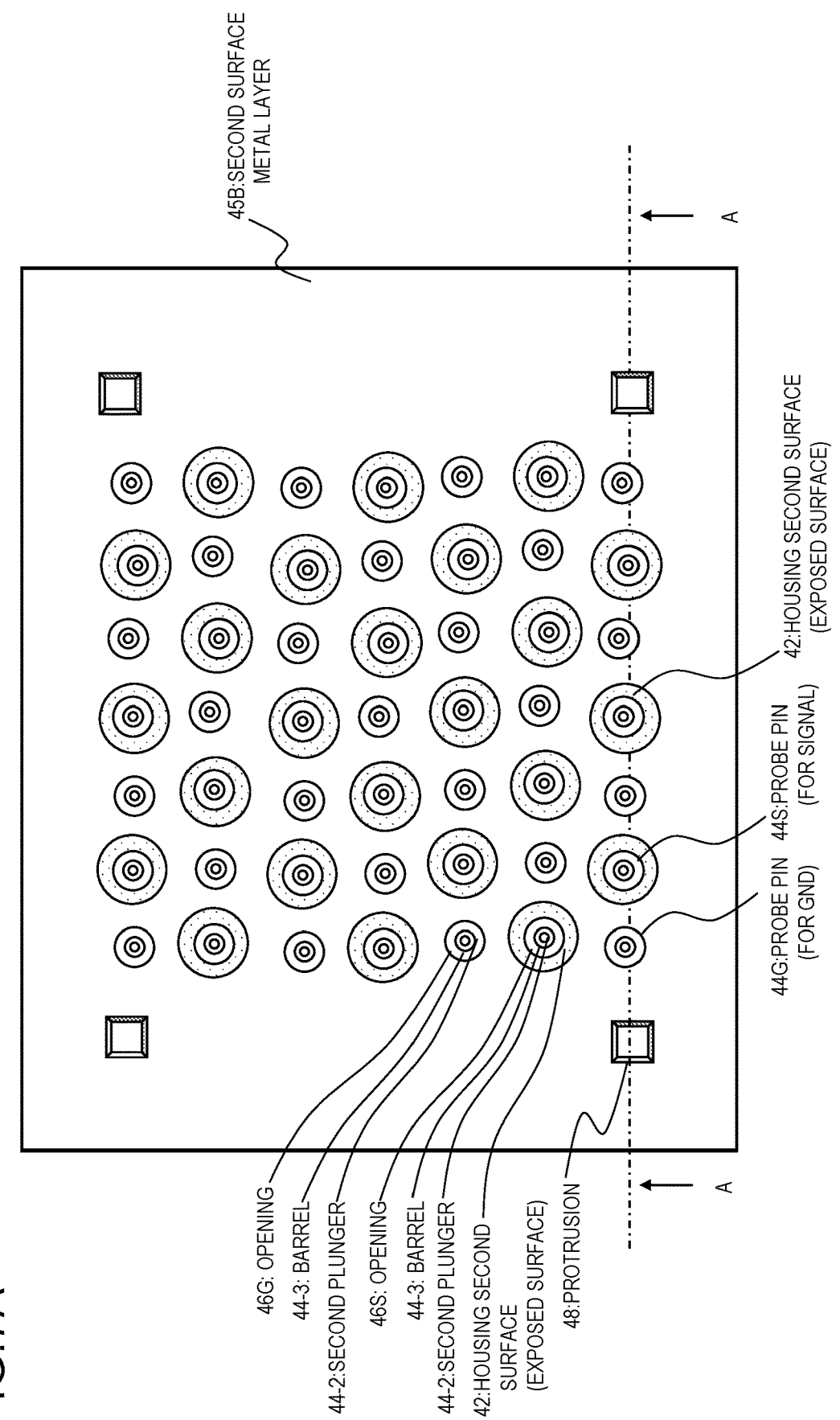
FIG. 7A is a schematic plan view illustrating one example of a socket in the variation 2 of the disclosure.

FIG. 7A is a schematic plan view of the second surface 42 of the housing 43 of the socket 40 illustrated in FIG. 6. FIG. 6 corresponds to a cross section of line A-A in FIG. 7A. In FIG. 7A, an arrangement pattern in which the signal probe pins 44S and the ground probe pins 44G are arranged alternately is merely an example for illustration. The number of probe pins 44 arranged in FIG. 7A is for illustrative purposes only and is, as a matter of course, not limited thereto.

In FIG. 7A, the second surface 42 of the housing 43 is covered with the metal layer 45 (referred to as a "second surface metal layer 45B"). A portion of surface of the barrel 44-3 of the ground probe pin 44G is exposed from the opening 46G for the ground probe pin 44G in the second surface metal layer 45B. The second plunger 44-2 protrudes toward a front side of the drawing. A tip of the second plunger 44-2 (tip of the contact part 44-2a) is truncated cone simply for the sake of drawing convenience. On the second surface 42 of the housing 43, the second surface metal layer 45B is removed in the vicinity of the opening 46S for the signal probe pin 44S. In the vicinity of the opening 46S, where the second surface metal layer 45B is removed, a portion of the second surface 42 of the housing 43 is exposed. The portion of the barrel 44-3 of the signal probe pin 44S is visible from the opening 46S on the second surface 42 of the housing 43 and the second plunger 44-2 is protrudes toward a front side from the plane of the drawing. As a non-limiting example, in the example illustrated in FIG. 7A, protrusions 48 are disposed at the four corners of the socket 40, on the outer circumference sides against the corresponding ground probe pins 44G. A planar shape of each protrusion 48 is not limited to a rectangle, but can be a circle, triangle, or any other shape. The protrusions 48 of the housing 43 may be integrally molded with the housing 43 and may be covered with the second surface metal layer 45B.

Figure 7B:
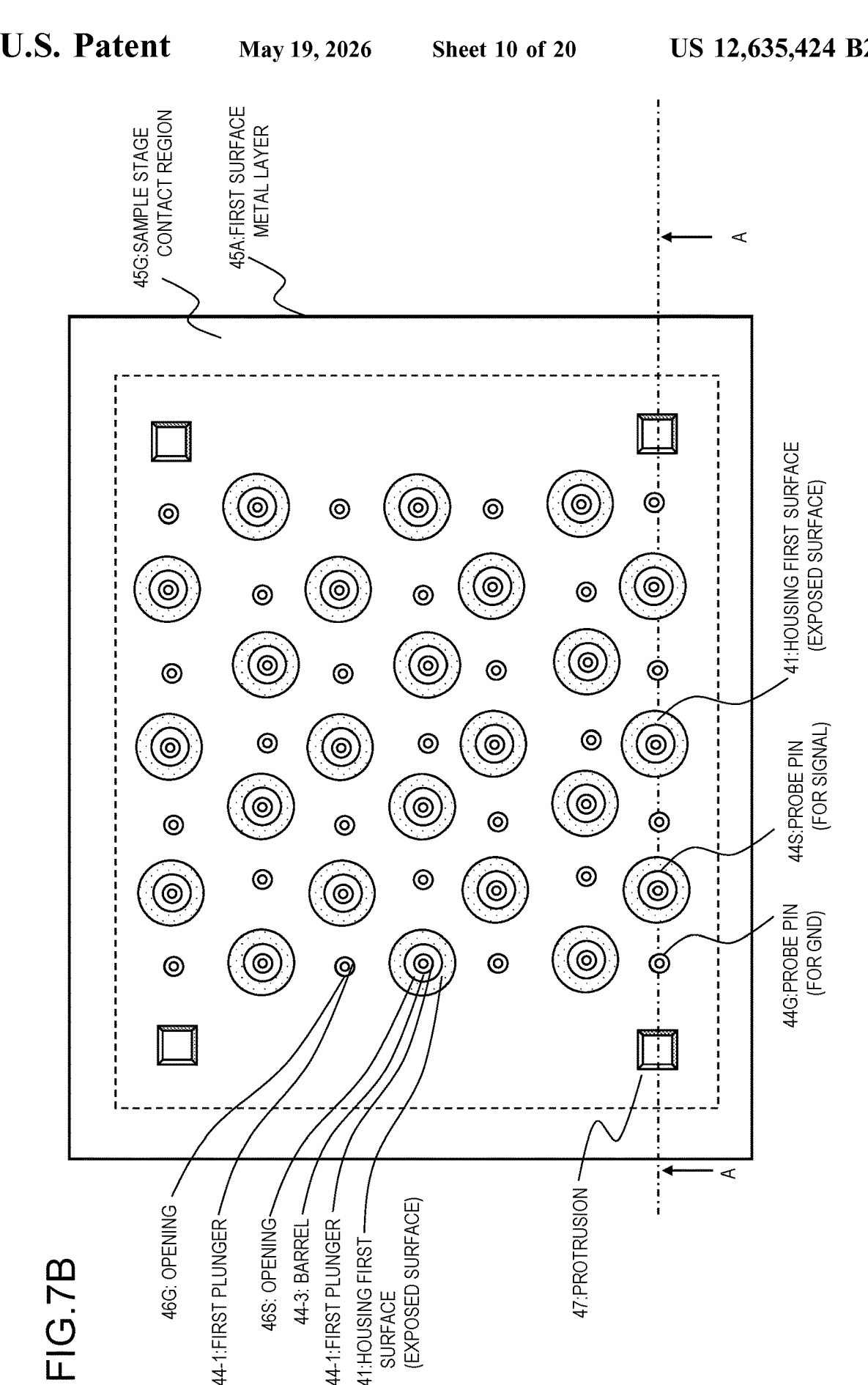
FIG. 7B is a schematic plan view illustrating one example of the socket according to the variation 2 of the disclosure.

FIG. 7B is a schematic plan view of the first surface 41 side of the housing 43 of the socket 40 illustrated in FIG. 6. FIG. 6 corresponds to a cross section of line A-A in FIG. 7B. In FIG. 7B, the first surface 41 side of the housing 43 is covered with the metal layer 45 (referred to as a "first surface metal layer 45A"). The first plunger 44-1 of the probe pin 44G protrudes toward a front of the drawing plane from the opening 46G for the ground probe pin 44G in the first surface metal layer 45A. On the first surface 41 of the housing 43, the first surface metal layer 45A in the vicinity of the opening 46S for the signal probe pin 44S is removed. A region where the first surface metal layer 45A is removed, a portion of the first surface 41 of the housing 43 is exposed. A portion of the barrel 44-3 of the signal probe pin 44S is visible from the opening 46S on the first surface 41 of the housing 43. The first plunger 44-1 protrudes toward a front side from the plane of the drawing. As a non-limiting example, in the example illustrated in FIG. 7B, protrusions 47 are disposed at the four corners of the socket 40, in correspondence with the protrusions 48 illustrated in FIG. 7A. Each protrusion 47 is disposed on an outer circumference side against corresponding ground probe pin 44G. In FIG. 7B, a region surrounded by an outer circumference of the socket 40 and a broken line is a contact region (sample stage contact region 45G) between the metal layer 45 (first surface metal layer 45A) on the first surface 41 of the housing 43 and the first opening bottom 35 (see FIG. 6) of the sample stage 30. A planar shape of each protrusion 47 is not limited to a rectangle, but can be a circle, triangle, or any other shape. The protrusions 47 of the housing 43 may be integrally molded with the housing 43 and covered with the first surface metal layer 45A.

Arrangements of the protrusions 48 on the second surface 42 side and the protrusions 47 on the first surface 41 side of the housing 43 are, as a matter of course, not limited to those illustrated in FIG. 7A and FIG. 7B.

Figure 7C:
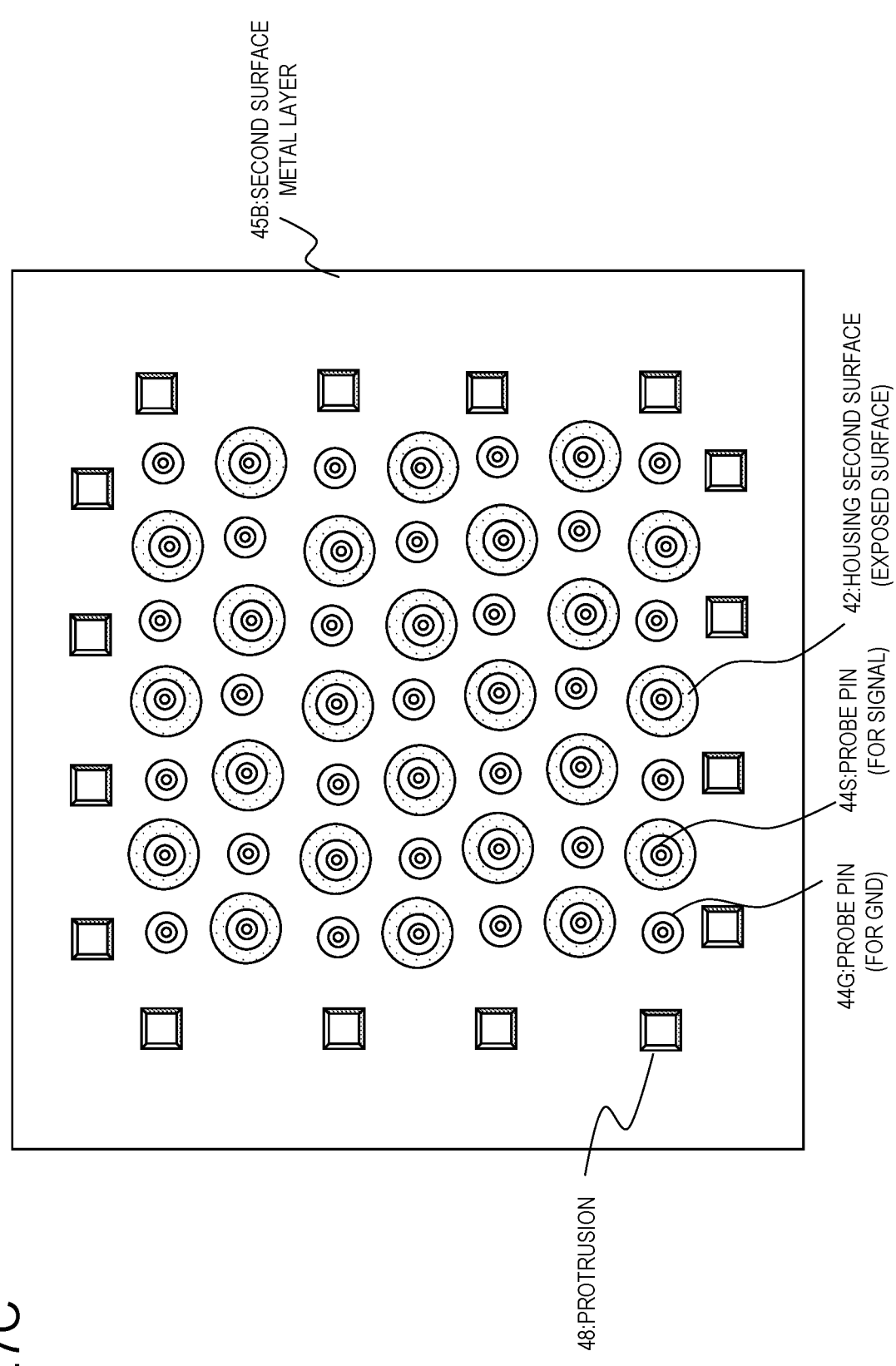
FIG. 7C is a schematic plan view illustrating another example of the socket according to the variation 2 of the disclosure.
Figure 7D:
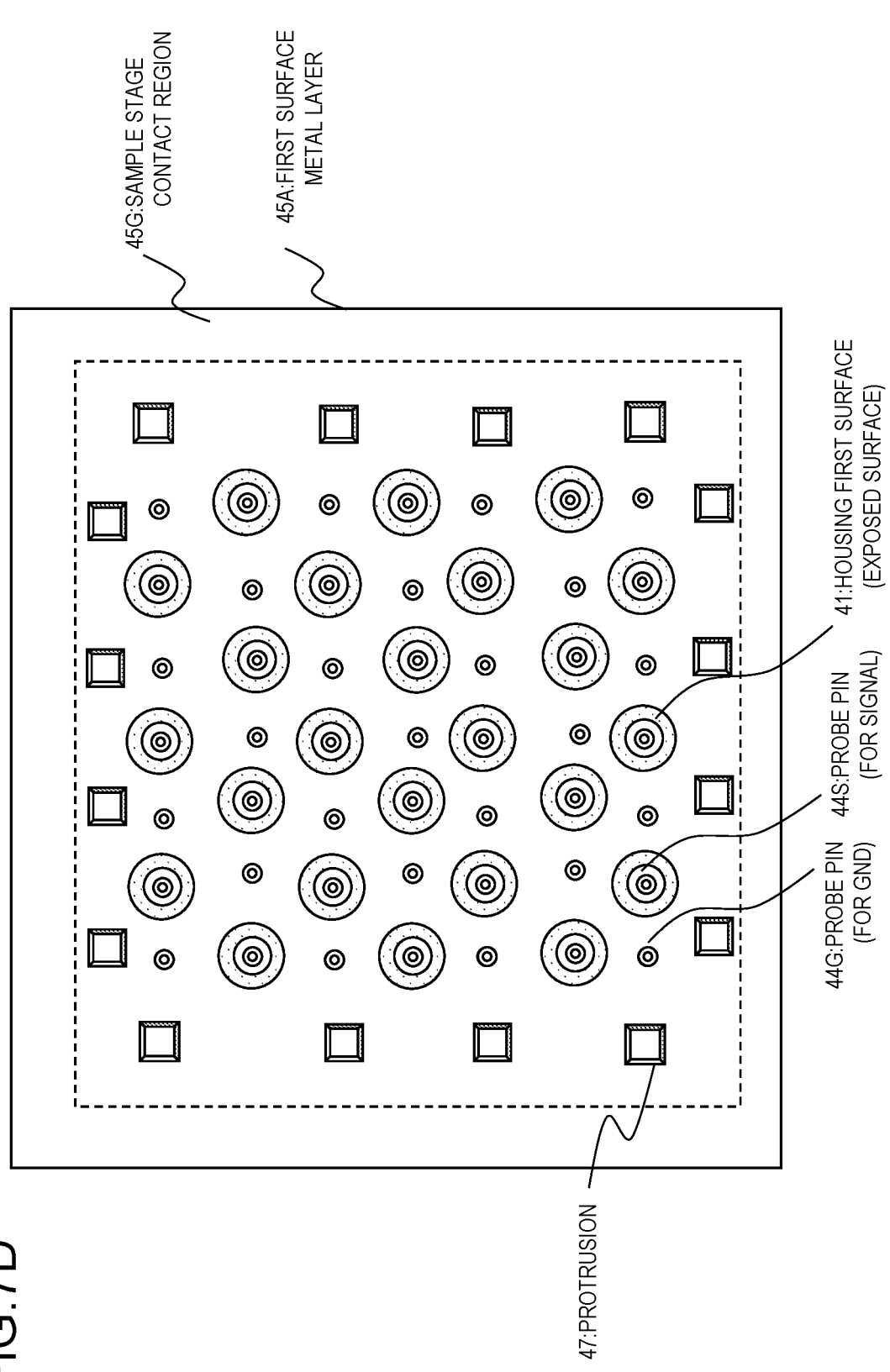
FIG. 7D is a schematic plan view illustrating the other example of the socket according to the variation 2 of the disclosure.

For example, as illustrated in FIG. 7C and FIG. 7D, the protrusions 48 and the protrusions 47 can, as a matter of course, be arranged in a region outside of the ground probe pins 44G, in a region surrounded by a sample stage contact region 45G (shown in FIG. 7D) which is to be made in contact with the first opening bottom 35 (FIG. 6) of the sample stage 30. In FIG. 7C and FIG. 7D, a pair of the protrusion 47 on the first surface 41 side and the protrusion 48 corresponding thereto on the second surface 42 side of the housing 43 may be arranged at the same position (coordinates) in the planes on the first surface 41 and the second surface 42 of the housing 43, respectively. In FIG. 7C and FIG. 7D, the protrusions 48 and the protrusions 47 are aligned in row along each edge of the sample stage contact region 45G, though not limited thereto.

The following configuration may be adopted to increase heat dissipation paths. That is, within a region in which the signal probe pins 44S and the ground probe pins 44G on the first surface 41 of the socket 40 are arranged, protrusions, each of which is covered with the metal layer 45 and located to avoid interference with the arrangement of the signal probe pins 44S and the ground probe pins 44G may be provided and may be brought into contact with the ground plane (ground pattern) of a wiring layer 22 on a second surface of an interposer 20. Similarly, within a region in which the signal probe pins 44S and the ground probe pins 44G on the second surface 42 of the socket 40, protrusions, each of which is covered with the metal layer 45 and located to avoid interference with the arrangement of the signal probe pins 44S and the ground probe pins 44G, and may be brought into contact with a ground plane (ground pattern) of a wiring layer 51 on a first surface of a board 50.

FIG. 8A to FIG. 13B illustrate an example of manufacturing and assembling process of the socket 40.

Figures 8A, 8B:
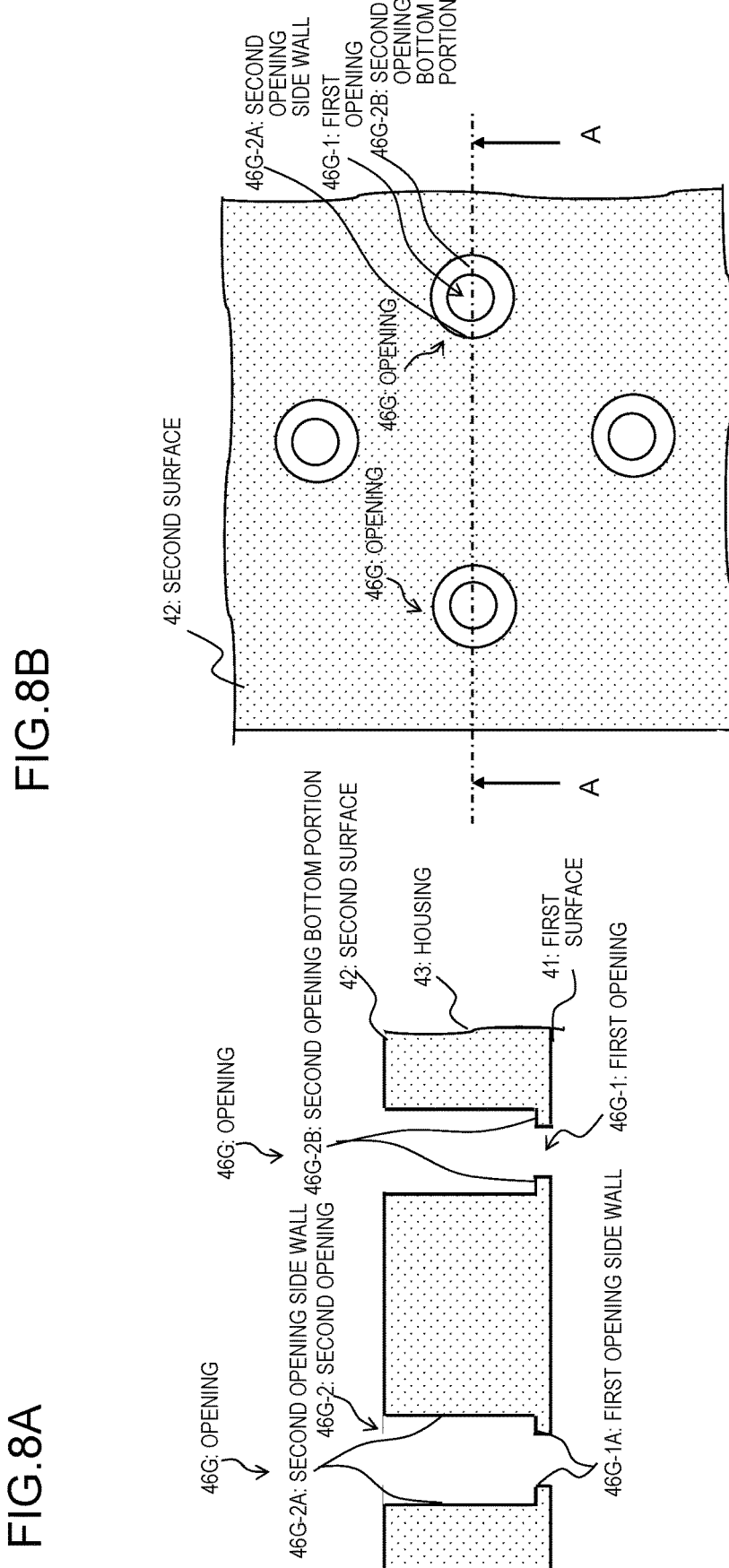
FIG. 8A is a schematic cross-sectional view illustrating a manufacturing of the socket of the disclosure.
FIG. 8B is a schematic plan view illustrating the manufacturing of the socket of the disclosure.

FIG. 8A a schematic cross-sectional view illustrating a cross-section of the housing 43 and FIG. 8B is a schematic plan view illustrating the second surface 42. FIG. 8A corresponds to a cross section of line A-A in FIG. 8B. In the schematic plan view of FIG. 8B, a plane is illustrated with the same hatching pattern as the housing 43 illustrated in FIG. 8A to make the correspondence with FIG. 8A easier to see. The same applies to FIG. 9A and FIG. 9B through FIG. 13A and FIG. 13B below.

As illustrated in FIG. 8A, a second opening 46G-2 is an opening of a predetermined diameter with bottom. The second opening 46G-2 may be bored, for example, by drilling from the second surface 42 side of the housing 43. A first opening 46G-1, whose diameter is smaller than the second opening 46G-2, may be bored, for example, by drilling on a first surface 41 side of the housing 43 to be interconnected to the second opening 46G-2, as a result of which an opening (through hole) penetrating through the housing 43 from a first surface 41 to a second surface 42 is opened. As a non-limiting example, after opening the second opening 46G-2 from the second surface 42 side of the housing 43, the first opening 46G-1 reaching the first surface 41 may be opened in the bottom of the second opening 46G-2. A barrel 44-3 of a ground probe pin 44G is housed inside a side wall 46G-2A (second opening side wall) of the second opening 46G-2. As a non-limiting example, in the opening 46G for the ground probe pin 44G, an inner diameter of the second opening 46G-2 may be, for example, on an order of a few (or several) hundreds of micrometers and an inner diameter of the first opening 46G-1 may be, for example, on an order of a hundred of micrometers. As a non-limiting example, a stroke of the probe pin 44G may be set to be on an order of a hundred to a few (or several) hundreds of micrometers and a length of the barrel 44-3 may be set to be, for example, 2 mm (millimeters) or less. As a further non-limiting example, a pitch of array of the probe pins may be on an order of about 0.3 mm.

Figures 9A, 9B:
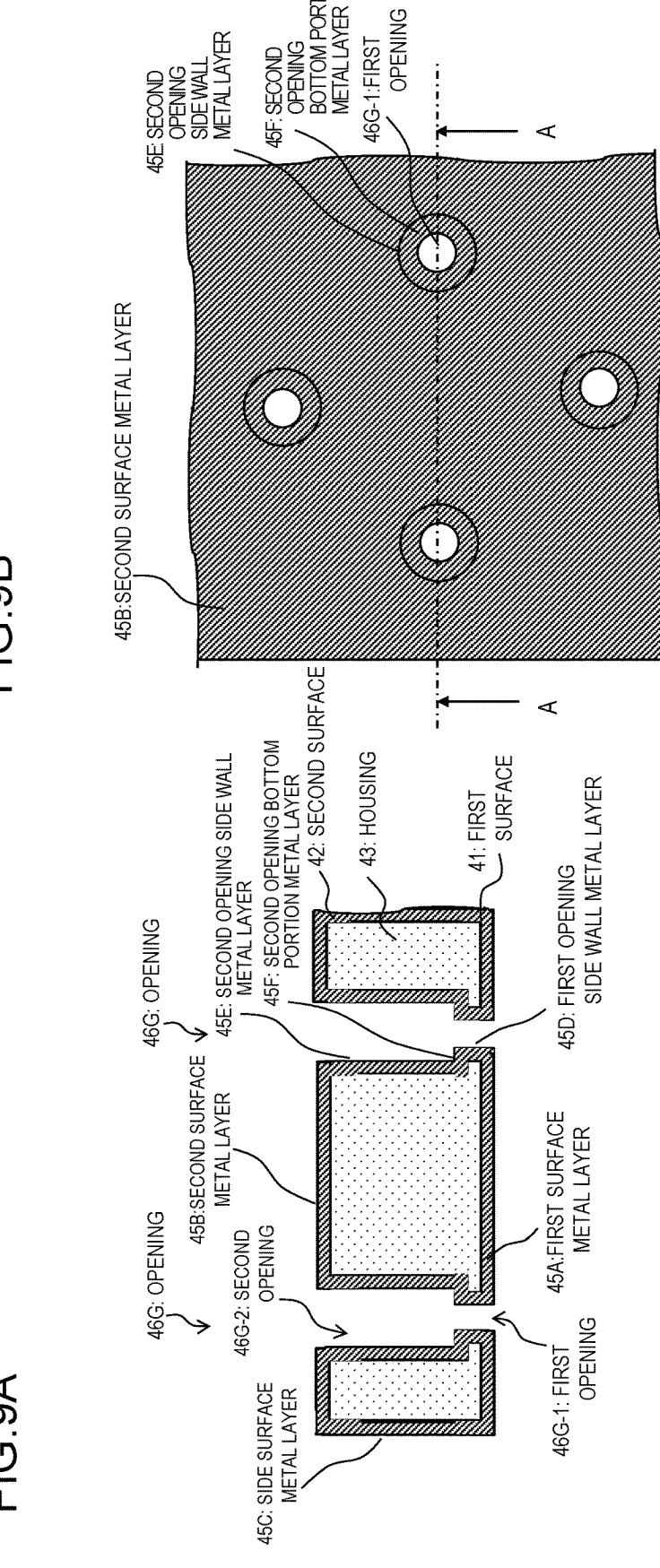
FIG. 9A is a schematic cross-sectional view illustrating a manufacturing of the socket of the disclosure.
FIG. 9B is a schematic plan view illustrating the manufacturing of the socket of the disclosure.

Next, the housing 43 is plated. FIG. 9A corresponds to a schematic cross-sectional view of the process next to that illustrated in FIG. 8A. FIG. 9B corresponds to a schematic plan view of the process next to that illustrated in FIG. 8B. As illustrated in FIG. 9A, a surface of the housing 43 (a first surface 41, a second surface 42 and a side surface) and the inner wall (side wall) of the opening 46G for the ground probe pin 44G are plated to form a metal film (metal layer). For example, in a case of copper plating used for through-hole plating, a plating thickness is at an extent of a few (or several) to 30 $\mu$m. The metal layer 45 to be coated on the surface of the housing 43 includes a first surface metal layer 45A, a second surface metal layer 45B, and a side surface metal layer 45C. The metal layer 45 to be coated in the opening 46G includes a first opening side wall metal layer 45D, a second opening side wall metal layer 45E, and a second opening bottom portion metal layer 45F. The first opening side wall metal layer 45D is connected to the first surface metal layer 45A, and the second opening side wall metal layer 45E is connected to the second surface metal layer 45B. In the schematic cross-sectional view illustrated in FIG. 9A, a plating thickness (thickness of the metal layer 45) is illustrated larger than its actual thickness as compared to a height of the housing 43, simply for the sake of drawing convenience.

Figures 10A, 10B:
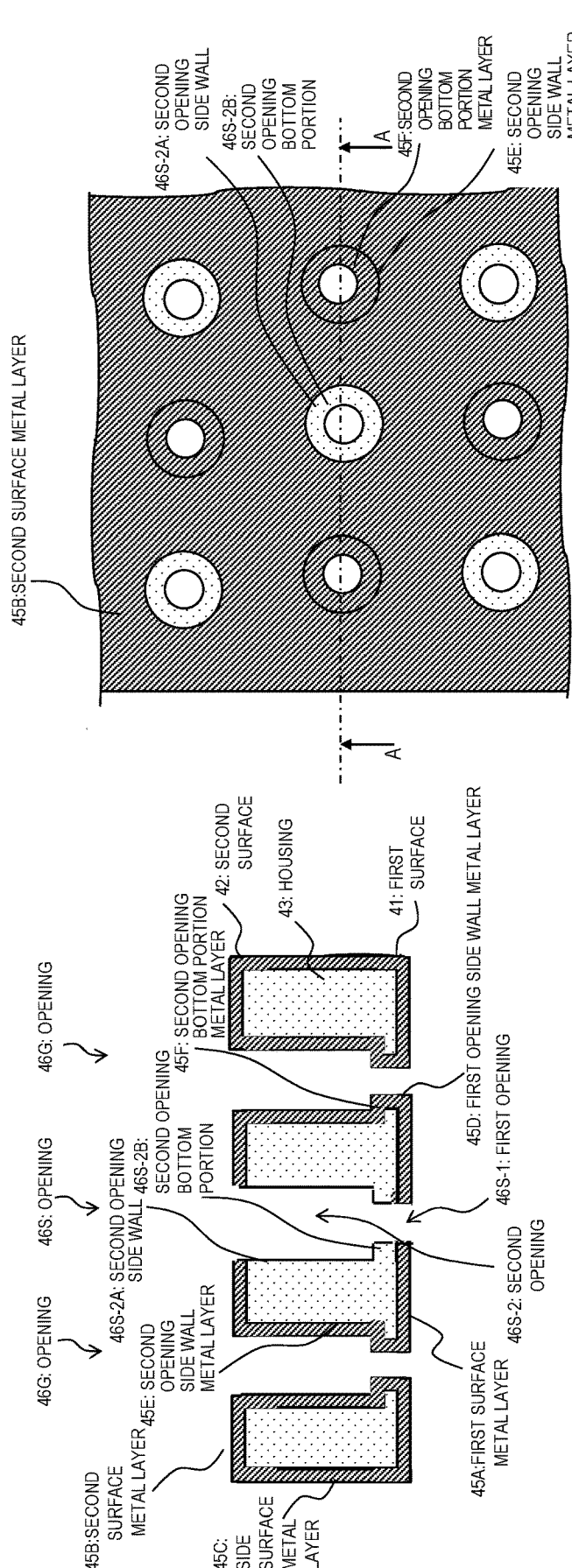
FIG. 10A is a schematic cross-sectional view illustrating a manufacturing of the socket of the disclosure.
FIG. 10B is a schematic plan view illustrating the manufacturing of the socket of the disclosure.

Next, an opening (through hole) for a signal probe pin 44S is formed in the housing 43 as plated. FIG. 10A corresponds to a schematic cross-sectional view of the process next to that illustrated in FIG. 9A. FIG. 10B corresponds to a schematic plan view of the process next to that illustrated in FIG. 9B. In the housing 43, a second opening 46S-2 is an opening of a predetermined diameter with bottom is bored, for example, by a drill from the second surface 42 side covered with the metal layer 45. A first opening 46S-1, whose diameter is smaller than the second opening 46S-2, is bored, for example, by a drill from the first surface 41 side covered with the metal layer 45. Thus, an opening (through hole) penetrating through the housing 43 from the first surface 41 to the second surface 42 is opened. A size (diameter and depth) of the first opening 46S-1 and the second opening 46S-2 for a signal probe pin 44S may be the same as that of the first opening 46G-1 and the second opening 46G-2 for the ground probe pin 44G, in a case where the same kind of probe pin as the ground probe pin 44G is used for the signal probe pin 44S. Alternatively, in case where a plating thickness is in an order of 10 to several tens of micrometers, the diameters of the first opening 46S-1 and the second opening 46S-2 for the signal probe pin 44S may be made narrower than the diameters of the first opening 46G-1 and the second opening 46G-2, by an extent equivalent to twice the plating thickness, in consideration of a width of the probe pin 44S and/or plating thickness. A depth of the first opening 46S-1 may be deeper than the first opening 46G-1 by the plating thickness, and a depth of the second opening 46S-2 in which the barrel 43 is to be housed, may be made shallower than the first opening 46G-2 by the plating thickness.

Figures 11A, 11B:
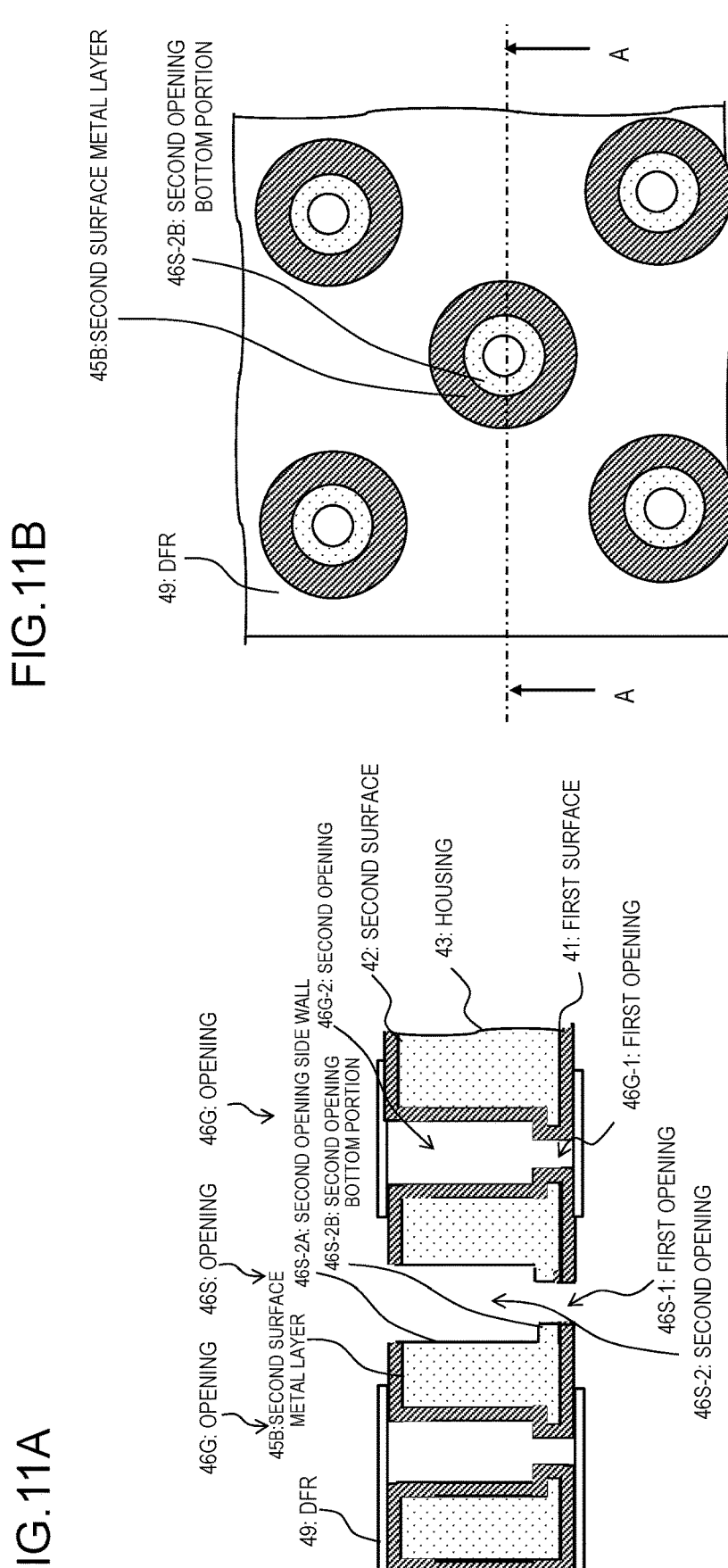
FIG. 11A is a schematic cross-sectional view illustrating a manufacturing of the socket of the disclosure.
FIG. 11B is a schematic plan view illustrating the manufacturing of the socket of the disclosure.

Next, a dry film resist is coated (or pasted) on the surface of the housing 43 and exposed and developed to form a pattern such that the resist remains on a region where a metal layer is to remain (unnecessary metal layer is to be removed). FIG. 11A corresponds to a schematic cross-sectional view of the process next to the process illustrated in FIG. 10A. FIG. 11B corresponds to a schematic plan view of the process next to the process illustrated in FIG. 10B. A dry film resist (DFR) 49 is coated on the surfaces of the housing 43 (the first surface 41, the second surface 42, and the side surface). When the dry film resist 49 is a photo-sensitive film whose exposed region is cured, a pattern is transferred to the dry film resist, and after exposure, the light-exposed areas are cured and the unexposed areas are not cured. By removing the unexposed region of the dry film resist using solvent, the dry film resist 49 is patterned to have a pattern illustrated in FIG. 11A and/or FIG. 11B. On the second surface 42 of the housing 43, the resist around edges of the second opening 46S-2 has been removed, and the second surface metal layer 45B is exposed in this region and the second opening bottom portion 46S-2B can be seen. A region around the first opening 46G-1 for the ground probe pin 44G on the first surface 41 of the housing 43, a region around the second opening 46G-2 of the probe pin 44 for ground on the second surface 42 of the housing 43, and the side surface of the housing 43 are covered with the dry film resist 49.

Next, using the dry film resist 49 on the surface of the housing 43 as a mask, an unnecessary metal layer (plating film) is removed with a stripping solution. FIG. 12A corresponds to a schematic cross-sectional view of the process next to that illustrated in FIG. 11A, in which the dry film resist 49 illustrated in FIG. 11A is removed. FIG. 12B corresponds to a schematic plan view of the process next to that illustrated in FIG. 11B and is a schematic plan view of the second surface 42 side of the housing 43 illustrated in FIG. 12A. On the second surface 42 of the housing 43, the second opening side wall metal layer 45E of the second opening 46G-2 for housing the ground probe pin 44G is connected to the second surface metal layer 45B. On the first surface 41 of the housing 43, the first surface metal layer 45A in a vicinity of an opening end of the first opening 46S-1 for housing the signal probe pin 44S is removed by etching, and a corresponding region (the vicinity of an opening end of the first opening 46S-1) on the first surface 41 of the housing 43 is exposed. On the second surface 42 of the housing 43, the second surface metal layer 45B in the vicinity of an opening end of the second opening 46S-2 for the signal probe pin 44S is also removed by etching, and a corresponding region on the second surface 42 of the housing 43 is exposed.

FIG. 13A is identical to the schematic cross-sectional view of FIG. 12A. FIG. 13B is a schematic plan view of the first surface 41 side (facing the interposer 20) of FIG. 13A. The first surface 41 of the housing 43 is covered with a first surface metal layer 45A. In this first surface metal layer 45A, the first opening 46G-1, through which a first plunger is passed, is opened as an opening for the ground probe pin 44G. On the first surface 41 of the housing 43, the first opening side wall metal layer 45D of the first opening 46G-1 for the ground probe pin 44G is connected to the first surface metal layer 45A. On the first surface 41 of the housing 43, the first surface metal layer 45A in the vicinity of the first opening 46S-1, through which a first plunger 44-1 of the signal probe pin 44S is to be passed, is removed, and a corresponding region on the first surface 41 of the housing 43 is exposed.

The housing 43 according to the example is manufactured using the above processes. In above manufacturing processes, a plating metal layer is formed by a subtractive method (etching method), but of course, a full additive method, in which the metal layer pattern is formed by electroless plating after resist formation, may also be used.

The socket 40 is completed when the ground probe pin 44G and the signal probe pin 44S are housed in the opening 46G and the opening 46S of the housing 43, respectively.

Figure 14:
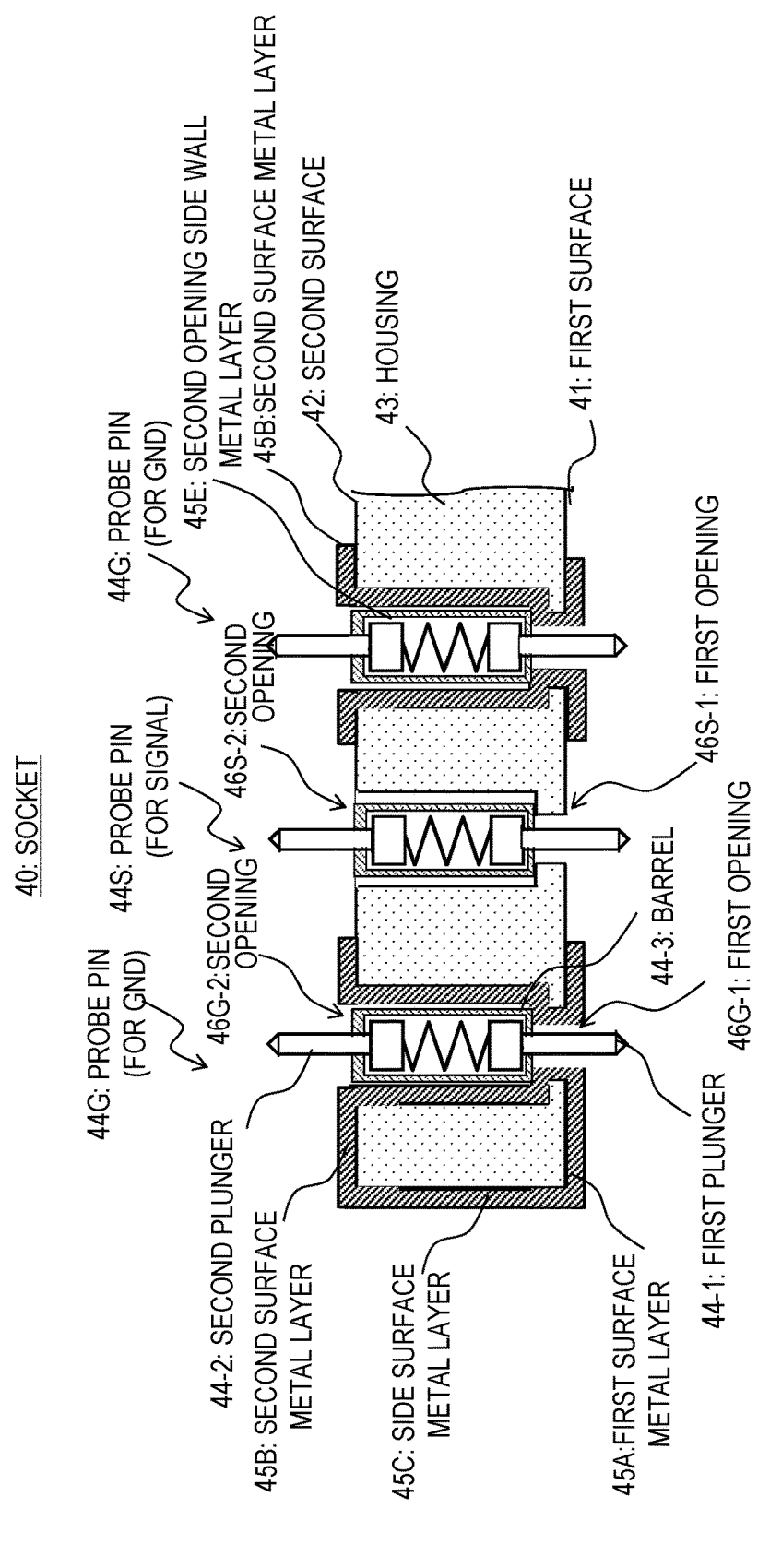
FIG. 14 is a schematic cross-sectional view illustrating a manufacturing of the socket of the disclosure.

FIG. 14 is a schematic cross-sectional view illustrating a state, in which the ground probe pin 44G (probe pin for GND) is housed in the opening 46G of the housing 43 and the signal probe pin 44S (probe pin for signal) is housed in the opening 46S of the housing 43, as described with reference to FIGS. 12A and 12B and FIGS. 13A and 13B. The ground probe pin 44G is inserted from the second opening 46G-2 on a side of the second surface 42 of the housing 43. The first plunger 44-1 of the ground probe pin 44G is inserted into the first opening 46G-1 and protruded from the first surface 41 of the housing. An outer circumference at one end (first plunger 44-1 side) of the barrel 44-3 of the ground probe pin 44G is mechanically (and electrically) in contact with the second opening bottom portion metal layer 45F (see FIG. 12A). A side of the barrel 44-3 is, thermally or thermally and mechanically in contact with the second opening side wall metal layer. The signal probe pin 44S is inserted from the second opening 46S-2 on a side of the second surface 42 of the housing 43. The first plunger 44-1 of the signal probe pin 44S is inserted into the first opening 46S-1 and protruded from the first surface 41 of the housing 43. One end (first plunger 44-1 side bottom) of the barrel 44-3 of the signal probe pin 44S is mechanically in contact with the second opening bottom portion 46S-2B (see FIG. 12A). The socket 40 is installed in a state where the sample stage contact region 45G (see FIG. 7B) on the outer edge side of the first surface 41 of the socket 40 is in contact with the first opening bottom 35 (see FIG. 4, etc.) of the sample stage 30 and a tip of the first plunger 44-1 and a tip of the second plunger 44-2 of the ground probe pin 44G and the signal probe pin 44S housed respectively in the opening 46G and the opening 46S are in press-contact with a terminal (pad) of the wiring layer 22 on the second surface of the interposer 20 and a terminal (pad) of the wiring layer 51 on the first surface of the board 50, respectively.

Depending on an axial length of the barrel 44-3 of the probe pin 44, the second surface 42 side of the housing 43 may also be configured to have the same opening as the first surface 41 side.

Figure 15:
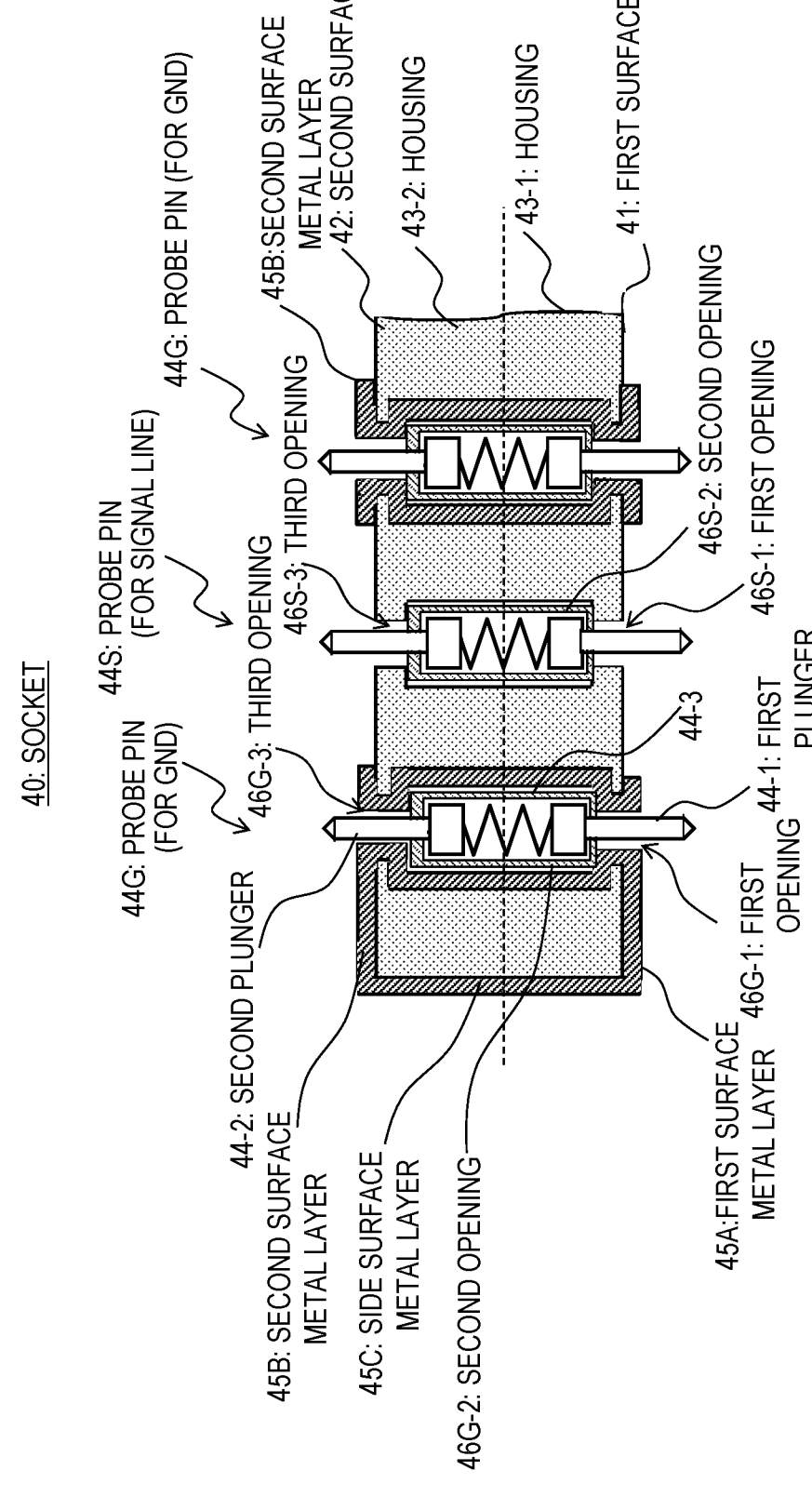
FIG. 15 is a schematic cross-sectional view illustrating a variation 3 of the disclosure.

Referring to FIG. 15, the opening 46G of the housing 43 which is to house the ground probe pin 44G, is configured by first to third openings 46G-1, 46G-2, and 46G-3 which are communicating to each other. The opening 46G-1 on the first surface side and the opening 46G-3 on the second surface side have the same diameter and depth. The barrel 44-3 of the ground probe pin 44G is housed and held in the second opening 46G-2 which has a larger diameter than that of the first and third openings 46G-1 and 46G-3. The first plunger 44-1 of the ground probe pin 44G is inserted into the first opening 46G-1 and protruded from the first surface 41 of the housing 43-1. The second plunger 44-2 of the ground probe pin 44G is inserted into the third opening 46G-3 and protruded from the second surface 42 of the housing 43-2. Similarly, the opening 46S of the housing 43 which is to house the signal probe pin 44S is configured by the first to third openings 46S-1, 46S-2, and 46S-3 which are communicating to each other. The opening 46S-1 on the first surface side and the opening 46S-3 on the second surface side have the same diameter and depth. The barrel 44-3 of the signal probe pin 44S is housed and held in the second opening 46S-2 which has a larger diameter than the first and third openings 46S-1 and 46S-3. The first plunger 44-1 of the signal probe pin 44S is inserted into the first opening 46S-1 and protruded from the first surface 41 of the housing 43-1. The second plunger 44-2 of the signal probe pin 44S is inserted into the third opening 46S-3 and protruded from the second surface 42 of the housing 43-2.

In FIG. 15, under a condition that two upper and lower housings 43-1 and 43-2 are assembled (combined in a unit), an opening to house the ground probe pin 44G is bored, then, the metal layer 45 is deposited, an opening to house the signal probe pin 44S is bored, and the first surface metal layer 45A and the second surface metal layer 45B in the vicinity of the opening to house the signal probe pin 44S are removed in the first surface 41 and the second surface 42, according to FIG. 8 to FIG. 13. When housing the signal probe pin 44S and the ground probe pin 44G, the combined unit is disassembled into two parts, i.e., the upper and lower housings 43-1 and 43-2. The first plungers 44-1 of the signal probe pin 44S and the ground probe pin 44G are respectively inserted into the first openings 46S-1 and 46G-1 of the housing 43-1. Under a state in which lower halves of the barrels 44-3 are housed (or inserted) in the second openings 46S-2 and 46G-2 of the housing 43-1, the second plungers 44-2 of the signal probe pin 44S and the ground probe pins

44G are respectively inserted into the third openings 46S-3 and 46G-3 of the housing 43-2, as if to close the housing 43-2 as a lid from above, whereby upper halves of the barrels 44-3 are respectively housed in the second openings 46S-2 and 46G-2 of the housing 43-2. In the configuration illustrated in FIG. 15, the barrels 44-3 of the signal probe pin 44S and the ground probe pin 44G are respectively fixed and housed in the housing 43-1 and 43-2.

According to the examples of the disclosure, by forming heat dissipation paths to the sample stage 30 in the socket 40, a cooling performance of the quantum chip 10 can be significantly improved as compared with that of the comparative example 2, while enabling to cope with provision of multiple terminals of the interposer 20.

The above examples of the disclosure can partially or entirely be described as following Supplementary notes (Notes), though not limited thereto.

(Note 1) A quantum device includes:

a quantum chip including a superconducting quantum circuit;

an interposer with a first surface on which the quantum chip is flip-chip mounted, the interposer including a plurality of through vias, each penetrating from the first surface to a second surface opposite of the first surface; and a socket that includes:

a housing including a plurality of openings, each bored between a first surface of the housing faced to the second surface of the interposer and a second surface opposite of the first surface of the housing; and a plurality of probe pins respectively housed in the plurality of openings, each probe pin having a first end and a second end axially opposite of the first end respectively protruding from the first surface and the second surface of the housing, the plurality of probe pins including a plurality of signal probe pins and a plurality of ground probe pin, wherein at least one opening housing the ground probe pin, includes a first metal layer covering an inner wall of the at least one opening, at least a part of the ground probe pin housed in the at least one opening being thermally in contact with first the metal layer of the inner wall of the at least one opening, wherein the housing includes a second metal layer formed on at least a partial region of at least one of the first surface and the second surface thereof, and wherein the first metal layer of the inner wall of the at least opening housing the ground probe pin, continues to the second metal layer formed on the at least the partial region of the at least one of the first surface and the second surface of the housing.

(Note 2) The quantum device according to Note 1, wherein in the housing, the inner wall of the opening for housing the signal probe pin is not covered with a metal layer.

(Note 3) The quantum device according to Note 1, wherein the metal layer formed on the first surface of the housing include a region in contact with a sample stage.

(Note 4) The quantum device according to Note 1, wherein on the at least one of the first surface and the second surface of the housing, a vicinity of the opening housing the signal probe pin is not covered with the second metal layer formed on at least the partial region of the at least one of the first surface and the second surface of the housing, in the vicinity of the opening housing the signal probe pin, a part of the at least one of the first surface and the second surface of the housing being exposed.

(Note 5) The quantum device according to Note 3, further including a board including a plurality of terminals on a first surface of the board, the plurality of terminal being respectively in contact with the second ends of the plurality of probe pins protruding from the second surface, wherein the first ends of the plurality of probe pins protruding from the first surface are respectively in contact with a plurality of terminals on the second surface of the interposer.

(Note 6) The quantum device according to Note 5, wherein the second metal layer formed on the first surface of the housing and/or the second metal layer formed on the second surface of the housing is/are in contact with a ground plane of the second surface of the interposer and/or a ground plane of the first surface of the board.

(Note 7) The quantum device according to Note 6, wherein the socket includes a plurality of first protrusion on the first surface of the housing, each covered with the second metal layer formed on the first surface of the housing, the second metal layer continuing to the first metal layer covering the inner wall of the opening housing the ground probe pin, the plurality of first protrusion on the first surface of the housing being in contact with the ground plane of the second surface of the interposer.

(Note 8) The quantum device according to Note 7, further including a plurality of second protrusion on the second surface of the housing, each covered with the second metal layer on the second surface of the housing, the second metal layer continuing to the first metal layer covering the inner wall of the opening housing the ground probe pin, the plurality of second protrusions on the second surface of the housing being in contact with a ground plane on the first surface of the board.

(Note 9) The quantum device according to Note 5, wherein the sample stage includes:

a first opening with a bottom, disposed on a surface of the sample stage;

a second opening with a bottom, the second opening disposed on the bottom of the first opening; and a third opening disposed on the bottom of the second opening, wherein the quantum chip is housed in the third opening, the interposer is housed in the second opening, the socket is housed in the first opening, the board is disposed on the surface to cover the first opening, a ground surface of an outer edge surrounding a region on the first surface of the interposer facing the quantum chip is in contact with an outer circumference region of the third opening disposed on the bottom of the second opening, the second metal layer on an outer edge surface of the first surface of the socket is in contact with an outer circumference region of the second opening disposed on the bottom of the first opening.

(Note 10) The quantum device according to Note 1, wherein in the housing, the opening to house each signal probe pin is opened in the housing after deposition of a metal layer on the housing to cover the first surface and the second surface of the housing and covering the inner wall of each of the plurality of opening to house the plurality of ground probe pins, the metal layer including the first metal layer and the second metal layer, on the first surface and the second surface, the metal layer in a vicinity of the opening to house each signal probe pin is removed.

The disclosure of each of PTL 1 and 2 is incorporated herein by reference thereto. Variations and adjustments of the example of the disclosures and examples are possible within the scope of the overall disclosure (including the claims) of the present invention and based on the basic technical concept of the present invention. Various combinations and selections of various disclosed elements (including the elements in each of the claims, examples, drawings, etc.) are possible within the scope of the claims of the present invention. Namely, the present invention of course includes various variations and modifications that could be made by those skilled in the art according to the overall disclosure including the claims and the technical concept.

What is claimed is:

1. A quantum device comprising:

a quantum chip including a superconducting quantum circuit;

an interposer with a first surface on which the quantum chip is flip-chip mounted, the interposer including a plurality of through vias, each penetrating from the first surface to a second surface opposite of the first surface; and a socket that includes:

a housing including a plurality of openings, each bored between a first surface of the housing faced to the second surface of the interposer and a second surface opposite of the first surface of the housing; and a plurality of probe pins respectively housed in the plurality of openings, each probe pin having a first end and a second end axially opposite of the first end respectively protruding from the first surface and the second surface of the housing, the plurality of probe pins including a plurality of signal probe pins and a plurality of ground probe pin, wherein at least one opening housing the ground probe pin, includes a first metal layer covering an inner wall of the at least one opening, at least a part of the ground probe pin housed in the at least one opening being thermally in contact with first the metal layer of the inner wall of the at least one opening, wherein the housing includes a second metal layer formed on at least a partial region of at least one of the first surface and the second surface thereof, wherein the first metal layer of the inner wall of the at least opening housing the ground probe pin, continues to the second metal layer formed on the at least the partial region of the at least one of the first surface and the second surface of the housing;

wherein a part of the metal layer formed on the first surface of the housing is in contact with a sample stage; and wherein the sample stage includes:

a first opening with a bottom, disposed on a surface of the sample stage;

a second opening with a bottom, the second opening disposed on the bottom of the first opening; and a third opening disposed on the bottom of the second opening, wherein the quantum chip is housed in the third opening, the interposer is housed in the second opening, the socket is housed in the first opening, the board is disposed on the surface to cover the first opening.

2. The quantum device according to claim 1, wherein the opening housing the signal probe pin includes no metal layer to cover an inner wall thereof.

3. The quantum device according to claim 1, wherein on the at least one of the first surface and the second surface of the housing, a vicinity of the opening housing the signal probe pin is not covered with the second metal layer formed on at least the partial region of the at least one of the first surface and the second surface of the housing, in the vicinity of the opening housing the signal probe pin, a part of the at least one of the first surface and the second surface of the housing being exposed.

4. The quantum device according to claim 1, wherein the housing is made of non-magnetic insulating material.

5. The quantum device according to claim 1, wherein the probe pin is made of at least one selected from a group including palladium (Pd) alloy, gold (Au) alloy, beryllium copper (BeCu), gold (Au) plated, niobium (Nb), niobium titanium (Nb—Ti), and titanium (Ti).

6. The quantum device according to claim 1, further comprising
  a board including a plurality of terminals on a first surface of the board, the plurality of terminals being respectively in contact with the second ends of the plurality of probe pins protruding from the second surface of the housing, wherein
  the first ends of the plurality of probe pins protruding from the first surface are respectively in contact with a plurality of terminals on the second surface of the interposer.

7. The quantum device according to claim 6, wherein the sample stage further includes:
  a ground surface of an outer edge surrounding a region on the first surface of the interposer facing the quantum chip is in contact with an outer circumference region of the third opening disposed on the bottom of the second opening, the second metal layer on an outer edge surface of the first surface of the socket is in contact with an outer circumference region of the second opening disposed on the bottom of the first opening.

8. The quantum device according to claim 6, wherein the sample stage is made of metal including at least one selected from a group including cupper (Cu), Cu alloy and aluminum (Al), or ceramics enabled to be cooled to an extremely low temperature.

9. The quantum device according to claim 6, wherein the second metal layer formed on the first surface of the housing and/or the second metal layer formed on the second surface of the housing is/are in contact with a ground plane of the second surface of the interposer and/or a ground plane of the first surface of the board.

10. The quantum device according to claim 9, wherein the socket includes
  a plurality of first protrusion on the first surface of the housing, each covered with the second metal layer formed on the first surface of the housing, the second metal layer continuing to the first metal layer covering the inner wall of the opening housing the ground probe pin,
  the plurality of first protrusion on the first surface of the housing being in contact with the ground plane of the second surface of the interposer.

11. The quantum device according to claim 10, further comprising
  a plurality of second protrusion on the second surface of the housing, each covered with the second metal layer on the second surface of the housing, the second metal layer continuing to the first metal layer covering the inner wall of the opening housing the ground probe pin, the plurality of second protrusions on the second surface of the housing being in contact with a ground plane on the first surface of the board.

12. The quantum device according to claim 1, wherein the probe pin is of a both-ends movable type or a one-end movable type.

13. The quantum device according to claim 12, wherein the probe pin includes:
  a barrel formed of a conductive material with a cavity axially elongated;
  a first plunger formed of a conductive material mounted in a cavity of the barrel proximate to a first end of the cavity to axially protrude from a first end of the barrel;
  a second plunger formed of a conductive material mounted in the cavity proximate to a second end of the cavity to axially protrude from a second end of the barrel;
  a spring formed of a conductive material positioned in the cavity between the first plunger and the second plunger to elastically press respectively the first plunger and the second plunger in opposite axial directions,
  in case where the probe pin is of the both ends movable type, the first plunger and the second plunger both enabled to slide axially, while in case where the probe pin is of the one end movable type, one of the first plunger and the second plunger enabled to slide axially,
  wherein the first end and the second end of the probe pin are tips of the first plunger and the second plunger.

14. The quantum device according to claim 13, wherein each of the plurality of openings provided in the housing includes:
  a first opening having one end opened to the first surface of the housing; and
  a second opening having one end opened to the second surface of the housing,
  an other end of the first opening communicating with an other end of the second opening, the first opening having an opening size smaller than that of the second opening,
  wherein the probe pin, when housed in the opening, has the barrel there of housed in the second opening of the opening, and
  the first plunger of the probe pin is inserted into the first opening and protruded from the first surface of the housing.

15. The quantum device according to claim 14, wherein each of the plurality of openings includes:
  a third opening having one end opened to the second surface of the housing,
  an other end of the third opening communicating with the other end of the second opening, the third opening having an opening size smaller than that of the second opening,
  wherein the second plunger of the probe pin housed in the opening is inserted into the first opening and protruded from the second surface of the housing.

16. The quantum device according to claim 14, wherein a side of the barrel of the ground probe pin housed in the opening is at least thermally in contact with the first metal layer covering the inner wall of the second opening, and
  the first end of the barrel of the ground probe pin is thermally and mechanically in contact with the first metal layer covering an outer edge of a bottom of the second opening around the other end of the first opening.

17. The quantum device according to claim 14, wherein the first end of the barrel of the signal probe pin housed in the opening is mechanically in contact with an outer edge of a bottom of the second opening around the other end of the first opening.

18. The quantum device according to claim 1, wherein in the housing, the opening to house each signal probe pin is opened in the housing after deposition of a metal layer on the housing to cover the first surface and the second surface of the housing and covering the inner wall of each of the plurality of opening to house the plurality of ground probe pins, the metal layer including the first metal layer and the second metal layer, on the first surface and the second surface, the metal layer in a vicinity of the opening to house each signal probe pin is removed.

19. The quantum device according to claim 18, wherein the metal layer is deposited by plating.

\* \* \* \* \*